(12) United States Patent  
Bistritzer et al.

(10) Patent No.: US 12,347,734 B2
(45) Date of Patent: Jul. 1, 2025

(54) EXAMINATION OF A HOLE FORMED IN A SEMICONDUCTOR SPECIMEN

(71) Applicant: Applied Materials Israel Ltd., Rehovot (IL)

(72) Inventors: Rafael Bistritzer, Petach Tikva (IL); Vadim Vereschagin, Ashdod (IL); Grigory Klebanov, Rishon-LeZion (IL); Roman Kris, Jerusalem (IL); Ilan Ben-Harush, Tel-Aviv (IL); Omer Kerem, Hod Hasharon (IL); Asaf Golov, Ness Ziona (IL); Elad Sommer, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 348 days.

(21) Appl. No.: 17/848,360

(22) Filed: Jun. 23, 2022

(65) Prior Publication Data

US 2023/0420308 A1    Dec. 28, 2023

(51) Int. Cl.
*H01L 21/66*    (2006.01)
*G06T 7/00*    (2017.01)
(Continued)

(52) U.S. Cl.
CPC ............ *H01L 22/12* (2013.01); *G06T 7/0004* (2013.01); *G06T 7/11* (2017.01); *G06T 7/50* (2017.01);
(Continued)

(58) Field of Classification Search
CPC ....... H01L 22/12; H01L 22/20; G06T 7/0004; G06T 7/11; G06T 7/50; G06T 7/66;
(Continued)

(56) References Cited

U.S. PATENT DOCUMENTS 11,056,404 B1    7/2021    Kris et al.

FOREIGN PATENT DOCUMENTS

| CN | 110175614 A | | 8/2019 | |
| JP | 2008034475 | * | 2/2008 | |
| TW | 201719156 | * | 6/2017 | ............. H01L 22/12 |

* cited by examiner

*Primary Examiner* — Jerome Grant, II
(74) *Attorney, Agent, or Firm* — LOWENSTEIN SANDLER LLP

(57) ABSTRACT

A system of examination of a semiconductor specimen, comprising a processor and memory circuitry (PMC) configured to:
  obtain an image of a hole formed in the semiconductor specimen, wherein the hole exposes at least one layer of a plurality of layers of the semiconductor specimen,
  segment the image into a plurality of regions,
  generate at least one of:
    data $D_{pix\_intensity}$ informative of one or more pixel intensities of one or more regions of the plurality of regions,
    data $D_{geometry}$ informative of one or more geometrical properties of one or more regions of the plurality of regions,
  feed at least one of $D_{pix\_intensity}$ or $D_{geometry}$ to a trained classifier to obtain an output, wherein the output of the trained classifier is usable to determine whether the hole ends at a target layer of the plurality of layers.

21 Claims, 16 Drawing Sheets

(51) Int. Cl.
    *G06T 7/11*           (2017.01)
    *G06T 7/50*           (2017.01)
    *G06T 7/66*           (2017.01)
    *G06V 10/764*       (2022.01)

(52) U.S. Cl.
    CPC .............. *G06T 7/66* (2017.01); *G06V 10/764* (2022.01); *G06T 2207/20021* (2013.01); *G06T 2207/30148* (2013.01)

(58) Field of Classification Search
    CPC . G06T 2207/20021; G06T 2207/30148; G06T 2207/20081; G06V 10/764; G06V 10/25; G06V 10/255; G06V 10/26; G06V 20/698; G06V 10/774; G01N 21/8851; G01N 21/9501; G01N 2021/8854; G01N 2021/8887
    USPC ........................................................ 382/106
    See application file for complete search history.

EXAMINATION OF A HOLE FORMED IN A SEMICONDUCTOR SPECIMEN

TECHNICAL FIELD

The presently disclosed subject matter relates, in general, to the field of examination of a specimen, and more specifically, to automating the examination of a specimen.

BACKGROUND

Current demands for high density and performance associated with ultra large-scale integration of fabricated devices require submicron features, increased transistor and circuit speeds, and improved reliability. Such demands require formation of device features with high precision and uniformity, which, in turn, necessitates careful monitoring of the manufacturing process, including automated examination of the devices while they are still in the form of semiconductor wafers.

The manufacturing process can include formation of a hole, using e.g., an etch process.

There is a growing need to provide an accurate, efficient and robust manner to evaluate holes formed by an etch process.

GENERAL DESCRIPTION

In accordance with certain aspects of the presently disclosed subject matter, there is provided a system of examination of a semiconductor specimen, the system comprising a processor and memory circuitry (PMC) configured to: obtain an image of a hole formed in the semiconductor specimen, wherein the hole exposes at least one layer of a plurality of layers of the semiconductor specimen, segment the image into a plurality of regions, generate at least one of data $D_{pix\_intensity}$ informative of one or more pixel intensities of one or more regions of the plurality of regions, or data $D_{geometry}$ informative of one or more geometrical properties of one or more regions of the plurality of regions, feed at least one of $D_{pix\_intensity}$ or $D_{geometry}$ to a trained classifier to obtain an output, wherein the output of the trained classifier is usable to determine whether the hole ends at a target layer of the plurality of layers.

According to some embodiments, the output of the trained classifier is informative of a classification of the hole to a class out of different classes that represent different possible outcomes of a manufacturing process of the hole.

According to some embodiments, the different classes include at least one of: (i) a properly etched hole; (ii) an under-etched hole; (iii) a first-degree over-etched hole; (iv) a second-degree over-etched hole, wherein the second-degree over-etched hole is deeper than the first-degree over-etched hole.

According to some embodiments, the hole is a tilted hole.

According to some embodiments, the image is not radially symmetric.

According to some embodiments, the system is configured to segment the image into a plurality of segments, wherein a majority or all of an area of the image on which said segmentation is performed corresponds to an image of the hole.

According to some embodiments, at least one of data $D_{pix\_intensity}$ or data $D_{geometry}$ comprises data usable to determine data informative of a depth of the hole.

According to some embodiments, at least one of data $D_{pix\_intensity}$ or data $D_{geometry}$ comprise data informative of one or more physical attributes of a manufacturing process of the hole.

According to some embodiments, at least one of data $D_{pix\_intensity}$ or data $D_{geometry}$ comprise data informative of one or more physical attributes of a manufacturing process of the hole in a NAND memory unit.

According to some embodiments, the image is segmented into a plurality of N regions $R_1$ to $R_N$, wherein, for a manufacturing process of said hole, a predefined region $R_i$ is informative of an over-etch, with i between 1 and N, wherein the system is configured to determine at least one of data $D_{geometry}$ or data $D_{pix\_intensity}$ informative of this predefined region $R_i$.

According to some embodiments, the predefined region $R_i$, informative of an over-etch, is selected based on its pixel intensity with respect to the pixel intensity of the other regions.

According to some embodiments, N is an integer which is equal to or greater than 2.

According to some embodiments, $D_{geometry}$ comprises data informative of a ratio between first data informative of an average radius of pixels located within a given region of the plurality of regions and second data informative of an average radius of pixels located within a second region of the plurality of regions, wherein the second region is different from the given region.

According to some embodiments, data $D_{pix\_intensity}$ comprises data informative of an average pixel intensity of a given region of the plurality of regions.

According to some embodiments, $D_{geometry}$ comprises data informative of a ratio between an area of the given region of the plurality of regions and a bounding area.

According to some embodiments, $D_{geometry}$ comprises data informative of a distance between a centre of gravity of a given region of the plurality of regions and a pixel of the given region which is the closest to the centre of gravity.

According to some embodiments, $D_{pix\_intensity}$ comprises data informative of a contrast between a given region of the plurality of regions and one or more regions different from the given region.

According to some embodiments, a given region of the plurality of regions includes a darkest area and a brightest area, wherein $D_{pix\_intensity}$ comprises data informative of a contrast between the darkest area and the brightest area.

According to some embodiments, $D_{pix\_intensity}$ comprises data informative of a contrast at a border between a given region of the plurality of regions, and a second region of the plurality of regions, different from the given region.

According to some embodiments, $D_{geometry}$ comprises data informative of a ratio between: (i) a distance between a centre of gravity of a given region of the plurality of regions, and a pixel of the given region, which is closest to the centre of gravity, and (ii) a distance between the centre of gravity of the given region of the plurality of regions, and a pixel of the given region, which is farthest from the centre of gravity.

According to some embodiments, $D_{geometry}$ determined for a given region is informative of whether the given region has, at least partially, an annular shape.

According to some embodiments, $D_{geometry}$ comprises data informative of a number of pixels in a predefined zone of a region of the plurality of regions, wherein the region is associated with a pixel intensity above a threshold.

According to some embodiments, $D_{geometry}$ comprises data informative of aside over-etch generated by a etch process of the hole.

According to some embodiments, the hole exhibits a high aspect ratio and has a width of a nanometric scale, wherein the hole exposes at least one layer of one or more sets of layers, wherein each set of layers comprises layers that differ from each other by their electron yield, wherein the specimen is an intermediate product manufactured by one or more manufacturing stages of a manufacturing process of a three-dimensional NAND memory unit.

According to some embodiments, the hole has a depth between 50 nm and 10.000 nm.

In accordance with certain aspects of the presently disclosed subject matter, there is provided a method of examination of a semiconductor specimen, the method comprising, by a processor and memory circuitry (PMC): obtaining an image of a hole formed in the semiconductor specimen, wherein the hole exposes at least one layer of a plurality of layers of the semiconductor specimen, segmenting the image into a plurality of regions, generating at least one of data $D_{pix\_intensity}$ informative of one or more pixel intensities of one or more regions of the plurality of regions, or data $D_{geometry}$ informative of one or more geometrical properties of one or more regions of the plurality of regions, feeding at least one of $D_{pix\_intensity}$ or $D_{geometry}$ to a trained classifier to obtain an output, wherein the output of the trained classifier is usable to determine whether the hole ends at a target layer of the plurality of layers.

According to some embodiments, the method can implement one of or more of the features described above with respect to the system.

In accordance with other aspects of the presently disclosed subject matter, there is provided a non-transitory computer readable medium comprising instructions that, when executed by a computer, cause the computer to perform the method above.

According to some embodiments, the proposed solution enables evaluating one or more characteristics of a hole formed in a semiconductor specimen using an image of the hole, even if the image is not radially symmetric.

According to some embodiments, the proposed solution enables evaluating one or more characteristics of a hole formed in a semiconductor specimen using an image of the hole, in the case of a deep hole (e.g., a hole which is formed through a hundred layers—this is not limitative).

According to some embodiments, the proposed solution enables evaluating one or more characteristics of a hole formed in a semiconductor specimen using an image of the hole, in the case of an image of the hole which has a low signal to noise ratio (SNR).

According to some embodiments, the proposed solution enables evaluating one or more characteristics of a hole formed in a semiconductor specimen using an image of the hole, in the case of a hole with a tilt.

According to some embodiments, the proposed solution enables evaluating one or more characteristics of a hole formed in a semiconductor specimen using an image of the hole, for one or more conditions in which previous techniques are unsuccessful.

According to some embodiments, the proposed solution detects one or more defects generated by a manufacturing process of a hole in a semiconductor specimen.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
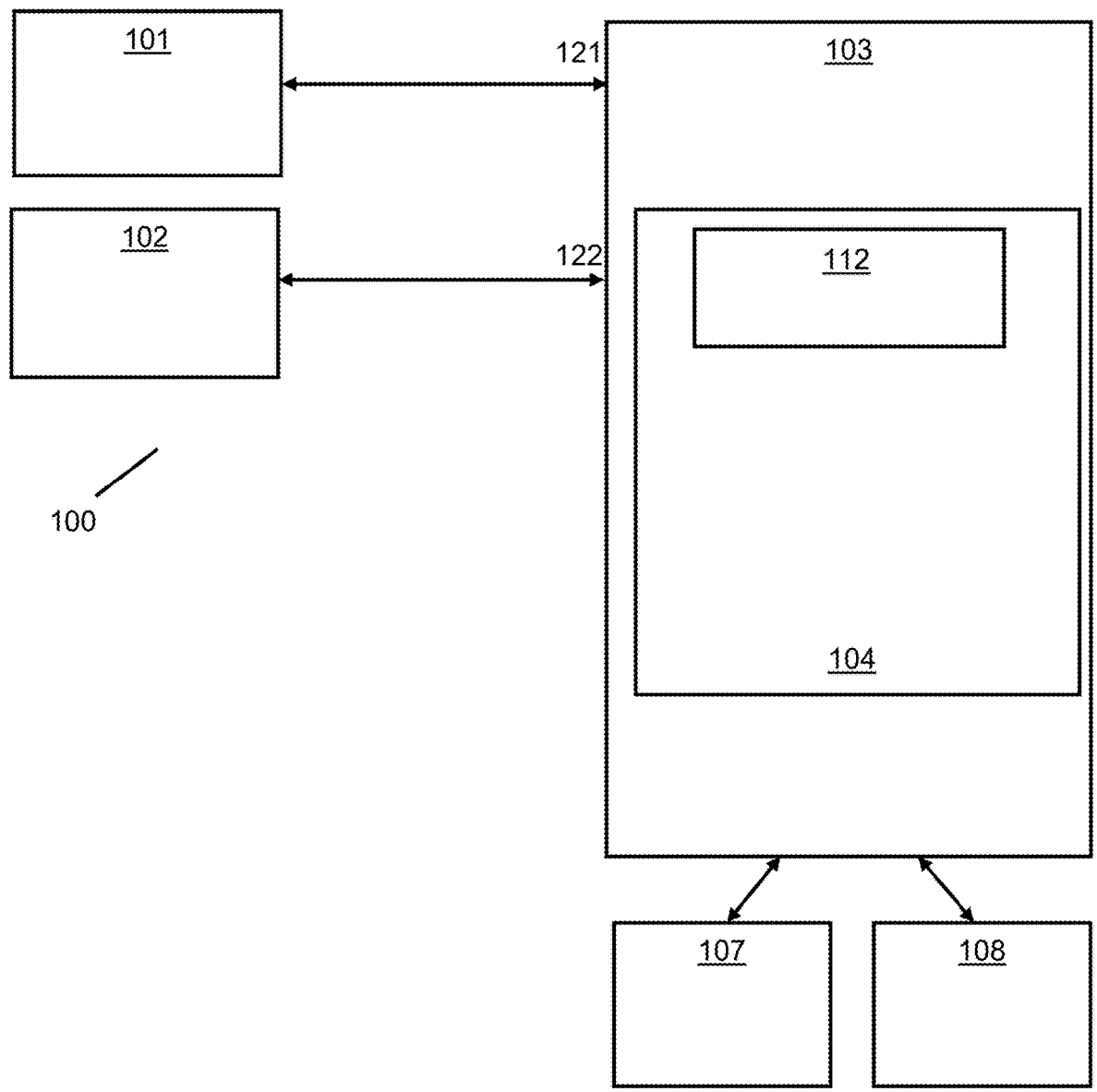
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components, and circuits have not been described in detail so as not to obscure the presently disclosed subject matter.

Unless specifically stated otherwise, as apparent from the following discussions, it is appreciated that throughout the specification discussions utilizing terms such as "using", "obtaining", "segmenting", "determining", "generating", "outputting", "feeding", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities, including, by way of non-limiting example, the system 103 and respective parts thereof disclosed in the present application.

The term "specimen" used in this specification should be expansively construed to cover any kind of wafer, masks, intermediate product(s) and other structures, combinations and/or parts thereof used for manufacturing semiconductor integrated circuits, magnetic heads, flat panel displays, memories and other semiconductor-fabricated articles.

The term "examination" used in this specification should be expansively construed to cover any kind of metrology-related operations as well as operations related to detection and/or classification of defects in a specimen during its fabrication. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification, are not limited with respect to resolution or size of an inspection area. A variety of non-destructive examination tools includes, by way of non-limiting example, scanning electron microscopes, atomic force microscopes, optical inspection tools, etc.

The term "defect" used in this specification should be expansively construed to cover any kind of abnormality or undesirable feature formed on or within a specimen.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g., of a wafer and/or parts thereof) as a part of the specimen fabrication process. The illustrated examination system 100 comprises computer-based system 103 capable of automatically determining metrology-related and/or defect-related information using images obtained during specimen fabrication. System 103 can be operatively connected to one or more low-resolution examination tools 101 and/or one or more high-resolution examination tools 102 and/or other examination tools. The examination tools are configured to capture images and/or to review the captured image(s) and/or to enable or provide measurements related to the captured image(s).

System 103 includes a processor and memory circuitry (PMC) 104. PMC 104 is configured to provide all processing necessary for operating the system 103 as further detailed hereinafter (see methods described in FIGS. 3, 5, which can be performed at least partially by system 103) and includes a processor (not shown separately) and a memory (not shown separately). The processor of PMC 104 can be configured to execute one or more functional modules in accordance with computer-readable instructions implemented on a non-transitory computer-readable memory comprised in the PMC. Such functional modules are referred to hereinafter as comprised in the PMC. A functional module comprised in PMC 104 includes a classifier 112. The classifier 112 can include any adapted classifier(s), such as a neural network classifier (such as a deep neural network (DNN)), a decision tree, a SVM (Support Vector Machine) algorithm. As explained hereinafter, the classifier 112 is generally trained using supervised learning.

By way of non-limiting example, the layers of the classifier 112 can be organized in accordance with Convolutional Neural Network (CNN) architecture, Recurrent Neural Network architecture, Recursive Neural Networks architecture, Generative Adversarial Network (GAN) architecture, or otherwise. Optionally, at least some of the layers can be organized in a plurality of DNN sub-networks. Each layer of the DNN can include multiple basic computational elements (CE), typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g., the weighted sum of the inputs) and further derive an output by applying an activation function to the computed activation. The activation function can be, for example, an identity function, a deterministic function (e.g., linear, sigmoid, threshold, or the like), a stochastic function, or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of the classifier 112 can be initially selected prior to training and can be further iteratively adjusted or modified during training to achieve an optimal set of weighting and/or threshold values in a trained classifier 112. After each iteration, a difference (also called loss function) can be determined between the actual output produced by the classifier 112 and the target output associated with the respective training set of data. The difference can be referred to as an error value. Training can be determined to be complete when a cost or loss function indicative of the error value is less than a predetermined value, or when a limited change in performance between iterations is achieved.

System 103 is configured to receive input data 121, 122. Input data 121, 122 can include data (and/or derivatives thereof and/or metadata associated therewith) produced by the examination tools 101, 102. It is noted that input data 121, 122 can include images (e.g., captured images, images derived from the captured images, simulated images, synthetic images, etc.) and associated numeric data (e.g., metadata, hand-crafted attributes, etc.). It is further noted that image data can include data related to a layer of interest and/or to one or more other layers of the specimen.

System 103 is further configured to process at least part of the received input data 121, 122 and send the results (or part thereof) to a storage system 107, to examination tool(s), to a computer-based graphical user interface (GUI) 108 for rendering the results and/or to external systems (e.g., Yield Management System (YMS) of a FAB).

By way of non-limiting example, a specimen can be examined by one or more low-resolution examination machines 101 (e.g., an optical inspection system, low-resolution SEM, etc.). The resulting data 121, informative of low-resolution images of the specimen, can be transmitted—directly or via one or more intermediate systems—to system 103. Alternatively, or additionally, the specimen can be examined by a high-resolution machine 102, such as a scanning electron microscope (SEM) or an Atomic Force Microscopy (AFM)). The resulting data 122, informative of high-resolution images of the specimen, can be transmitted—directly or via one or more intermediate systems—to system 103.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

Without limiting the scope of the disclosure in any way, it should also be noted that the examination tools can be implemented as inspection machines of various types, such as optical imaging machines, electron beam inspection machines, and so on. In some cases, the same examination tool can provide low-resolution image data and high-resolution image data. In some cases, at least one examination tool can have metrology capabilities.

It is noted that the examination system illustrated in FIG. 1 can be implemented in a distributed computing environment, in which the aforementioned functional modules shown in FIG. 1 can be distributed over several local and/or remote devices and can be linked through a communication network. It is further noted that in other embodiments at least some examination tools 101 and/or 102, storage system 107, and/or GUI 108 can be external to the examination system 100 and operate in data communication with system 103. System 103 can be implemented as stand-alone computer(s) to be used in conjunction with the examination tools. Alternatively, the respective functions of the system can, at least partly, be integrated with one or more examination tools.

Figure 2A:
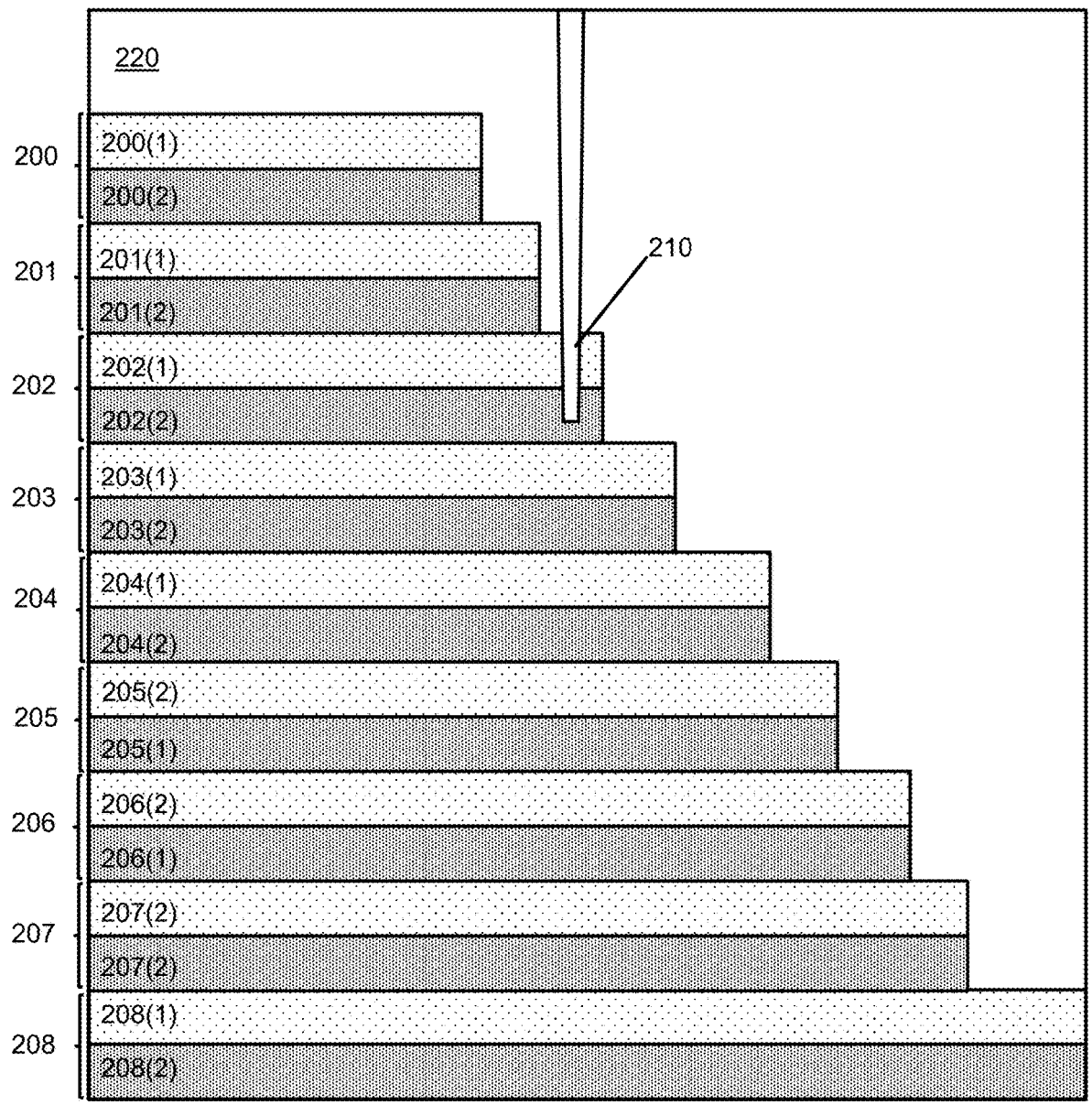
FIG. 2A illustrates a non-limitative example of a hole formed in layers of a specimen.

Attention is now drawn to FIG. 2A.

During manufacturing of a semiconductor specimen, it can be required to form a hole in one or more layers of the specimen. The hole can be formed using an etch process. Following the etch process, the hole can be filled with at least one conductive material. This enables to manufacture a structural element, such as (but not limited to) a conductor (e.g., contact).

A non-limiting example of a semiconductor specimen includes a three-dimensional NAND memory unit. Note that manufacturing of a semiconductor specimen generally involves multiple manufacturing stages. The formation of the holes by the etch process is one of the manufacturing stages. An outcome of each manufacturing stage is a semiconductor specimen which is generally called an "intermediate product". The output of the final manufacturing stage of the manufacturing process provides the final semiconductor specimen (e.g., a three-dimensional NAND memory unit).

FIG. 2A illustrates a non-limiting example of a specimen (e.g., intermediate product), which includes a plurality of layers. In some embodiments, the specimen includes pairs (see 200 to 208) of conductive layers (see 200(2) to 208(2)) and non-conductive layers (see 200(1) to 208(1)). Each pair of layers may include a non-conductive layer that is located on top of a conductive layer. This is however not limitative, and the specimen may include layers which are not arranged according to pairs of layers. In FIGS. 2A to 2F, nine pairs of layers are depicted. This is not limitative, and a different number of layers can be used. It should be noted that a set of layers may include more than two layers that differ from each other by electron yield, and that any set of layers may include multiple conductivity levels.

The nine sets of layers include first non-conductive layer 200(1), first conductive layer 200(2), second non-conductive layer 201(1), second conductive layer 201(2), third non-conductive layer 202(1), third conductive layer 202(2), fourth non-conductive layer 203(1), fourth conductive layer 203(2), fifth non-conductive layer 204(1), fifth conductive layer 204(2), sixth non-conductive layer 205(1), and sixth conductive layer 205(2), seventh non-conductive layer 206(1), seventh conductive layer 206(2), eight non-conductive layer 207(1), eight conductive layer 207(2), ninth non-conductive layer 208(1) and ninth conductive layer 208(2).

As mentioned above, a non-limiting example of such a specimen is a three-dimensional NAND memory unit. Each pair may be regarded as a set of layers that differ from each other by electron yield. Accordingly, more electrons are expected to be emitted from a conductive layer of a pair of layers in relation to electrons emitted from a non-conductive layer of the pair.

In some embodiments, the pairs of layers can be arranged in a staircase formation. Each stair includes a single pair. The staircase formation enables to connect each pair to a conductor. In some embodiments, the layers form a staircase structure in which each set of layers is wider than all sets of layers located above the set of layers. This is not limitative.

Figure 2B:
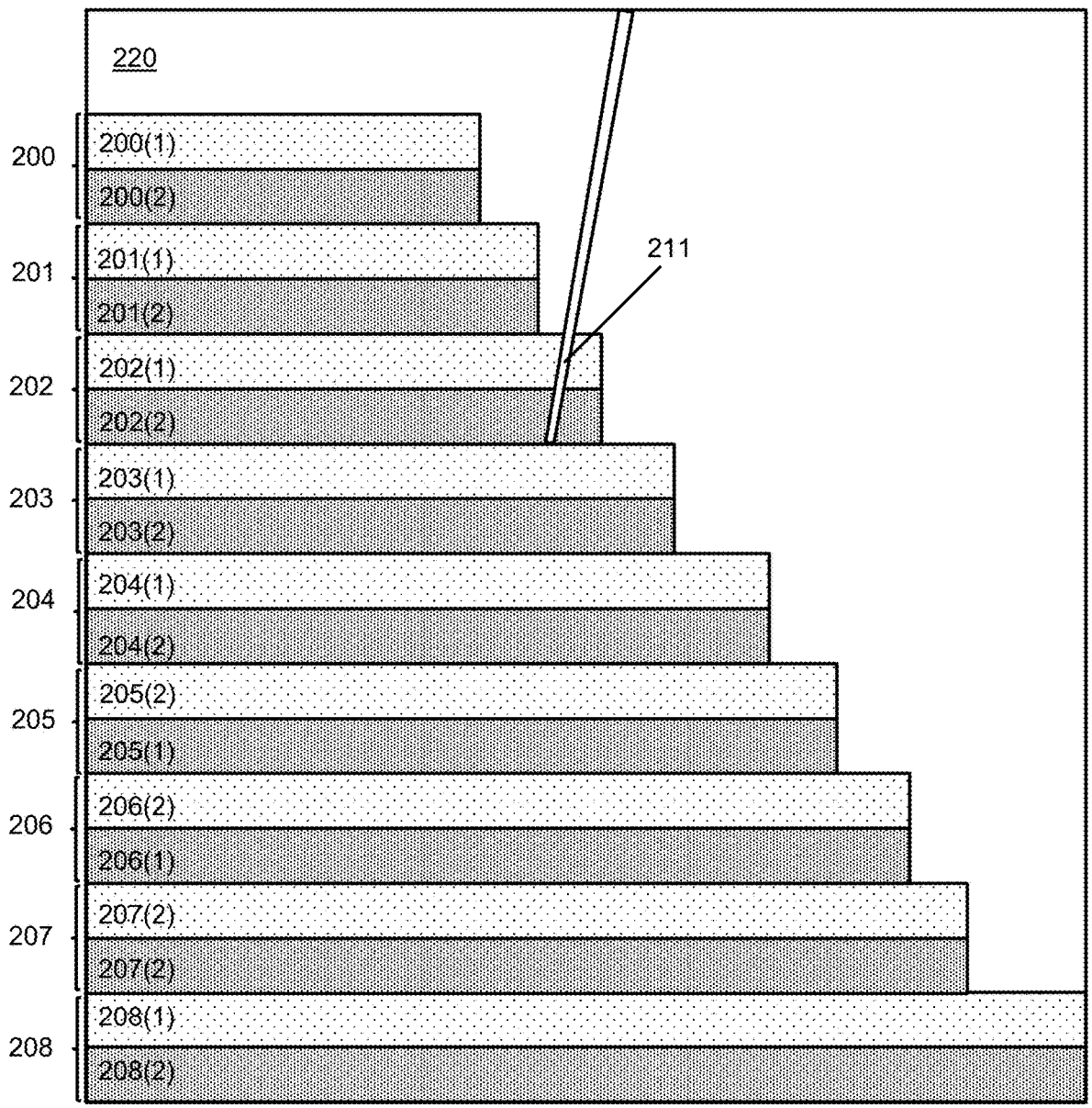
FIG. 2B illustrates another non-limitative example of a hole formed in layers of a specimen, in which the hole is tilted.

Ideally, the formed conductor is vertical, but deviations in the manufacturing process can cause the hole to be non-vertical (tilted), and, in turn, the formed conductor to be non-vertical. A non-limiting example is illustrated in FIG. 2B. This type of deviation can be present in particular when the hole is deep: since the hole has to pass through a large number of layers, the manufacturing process can induce a tilt in the hole. As a consequence of this tilt, the resulting image of the hole can be non-symmetric. In a non-limiting example, the tilt angle of the hole (with respect to a vertical direction) is less than one degree.

In some embodiments, the hole exhibits a high aspect ratio. The term "aspect ratio" means a ratio between a depth and a width of an element. A high aspect ratio may be regarded as an aspect ratio that exceeds, for example, 5:1.

In some embodiments, the hole has a width of nanometric scale. The term "nanometric scale" means a value that may range between 5 nm and 100 nm.

In some embodiments, the hole has a height (also called depth) in a range between 50 nm and 10.000 nm (or in any sub-interval within this range).

In FIGS. 2A to 2E, the layers are covered by a top region 220 (which is for example an insulator or a top covering layer). The layers may be covered by multiple regions of various shapes and/or size, and/or by other layers.

Attention is now drawn to FIGS. 2C-2F which illustrate examples of a first hole 230, a second hole 232, a third hole 234 and a fourth hole 236 that are formed in a part of a specimen (e.g., intermediate product).

For simplicity of explanation, each figure illustrates a single hole that is aimed to a different target region. This is however not limitative.

Figure 2C:
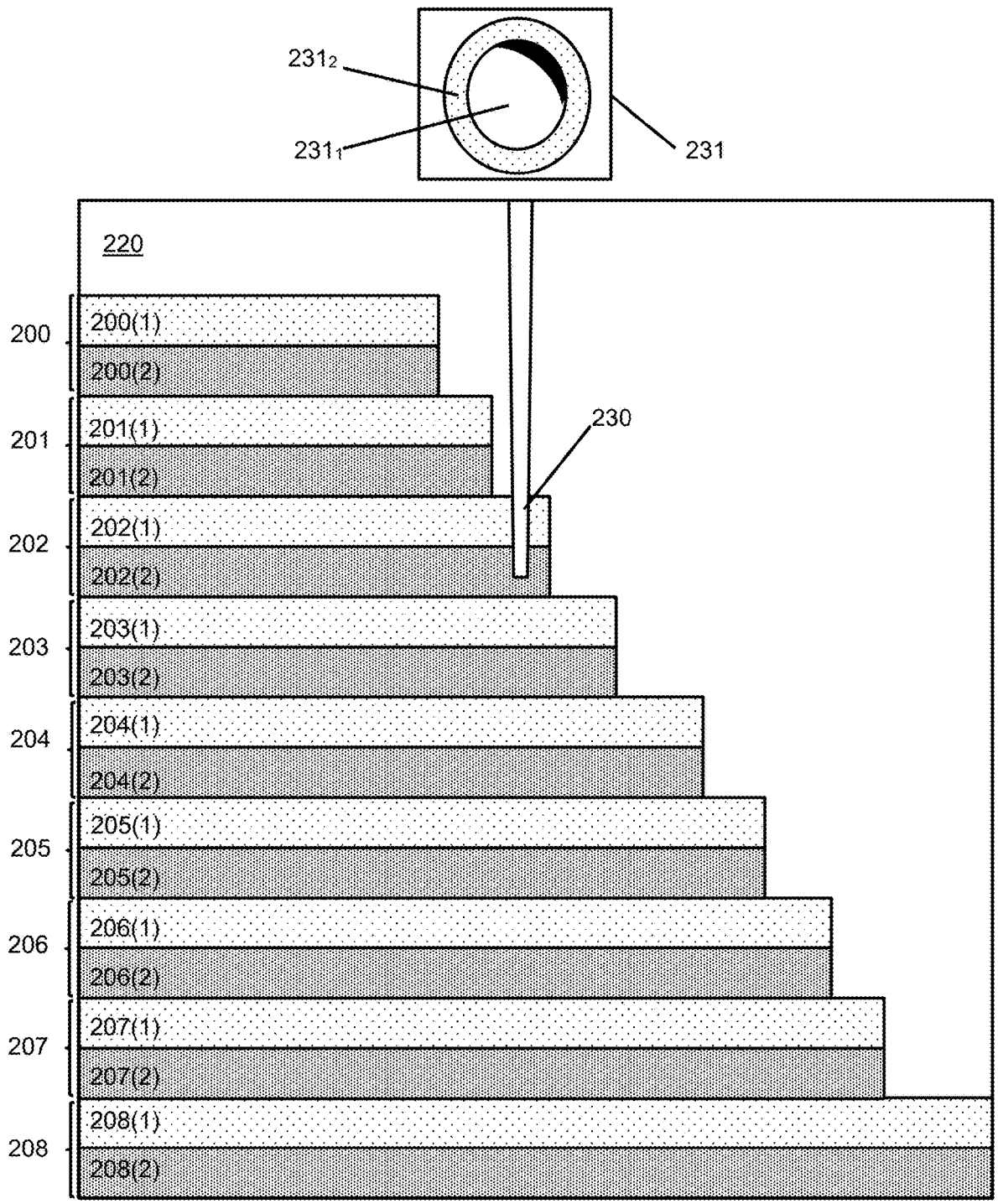
FIG. 2C illustrates a non-limitative example of a proper hole, which reaches the target layer.

The first hole 230 of FIG. 2C is a proper hole. Indeed, it ends at the target layer, and does not expose layers located under the target layer. In the example of FIG. 2C, the first hole 230 exposes the second target layer 202(2) which is conductive and belongs to the third set of layers 202, and the second non-conductive layer 202(1) that is located above the second target layer 202(2) and also belongs to the third set of layers 202.

Note that the representation of FIG. 2C is schematic: generally, the hole passes through a multiplicity of layers (for example, a hundred—this is not limitative) until it reaches the target layer. FIG. 2C only depicts the last two layers (deepest layers) through which the hole passes.

Image 231 (an electron image), informative of the first hole 230 of FIG. 2C, includes a center $231_1$ that represents second target layer 202(2), and a peripheral region $231_2$ that represents a second non-conductive layer 202(1).

In some embodiments, the image of the hole is not symmetric (no radial symmetry). This is illustrated in the non-limiting example of FIG. 2C, in which the image 231 is not radially symmetric (due to the presence of the feature $232_2$). In some embodiments, most of the image of the hole is not symmetric.

Figure 2D:
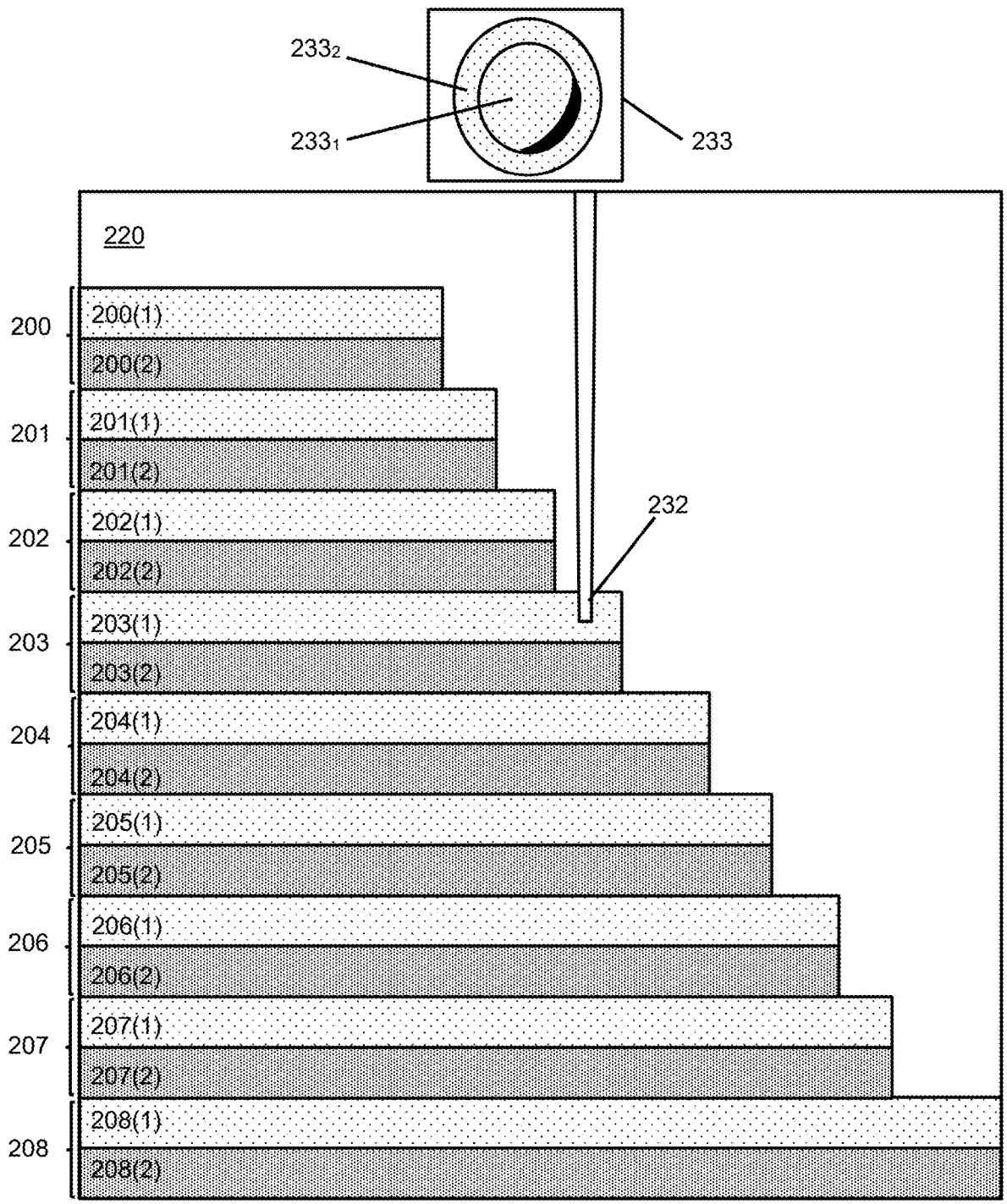
FIG. 2D illustrates a non-limitative example of an under-etched hole.

The second hole 232 of FIG. 2D is an under-etched hole. In other words, the depth of the hole is not sufficient, and therefore, the second hole 232 does not expose the target layer. The second hole 232 does not reach the fourth target layer 203(2) which is conductive and belongs to the fourth set of layers 203. The second hole 232 exposes only the fourth non-conductive layer 203(1) that is located above the fourth target layer 203(2) and also belongs to the fourth set of layers 203.

Note that the representation of FIG. 2D is schematic: generally, the hole passes through a multiplicity of layers (for example, a hundred—this is not limitative) until it reaches the layer 203(1).

Image 233 (an electron image), informative of the second hole 232 of FIG. 2D, includes a center $233_1$ and a peripheral region $231_2$ that represents the fourth non-conductive layer 203(1).

In some embodiments, the image of the under-etched hole is not symmetric.

Figure 2E:
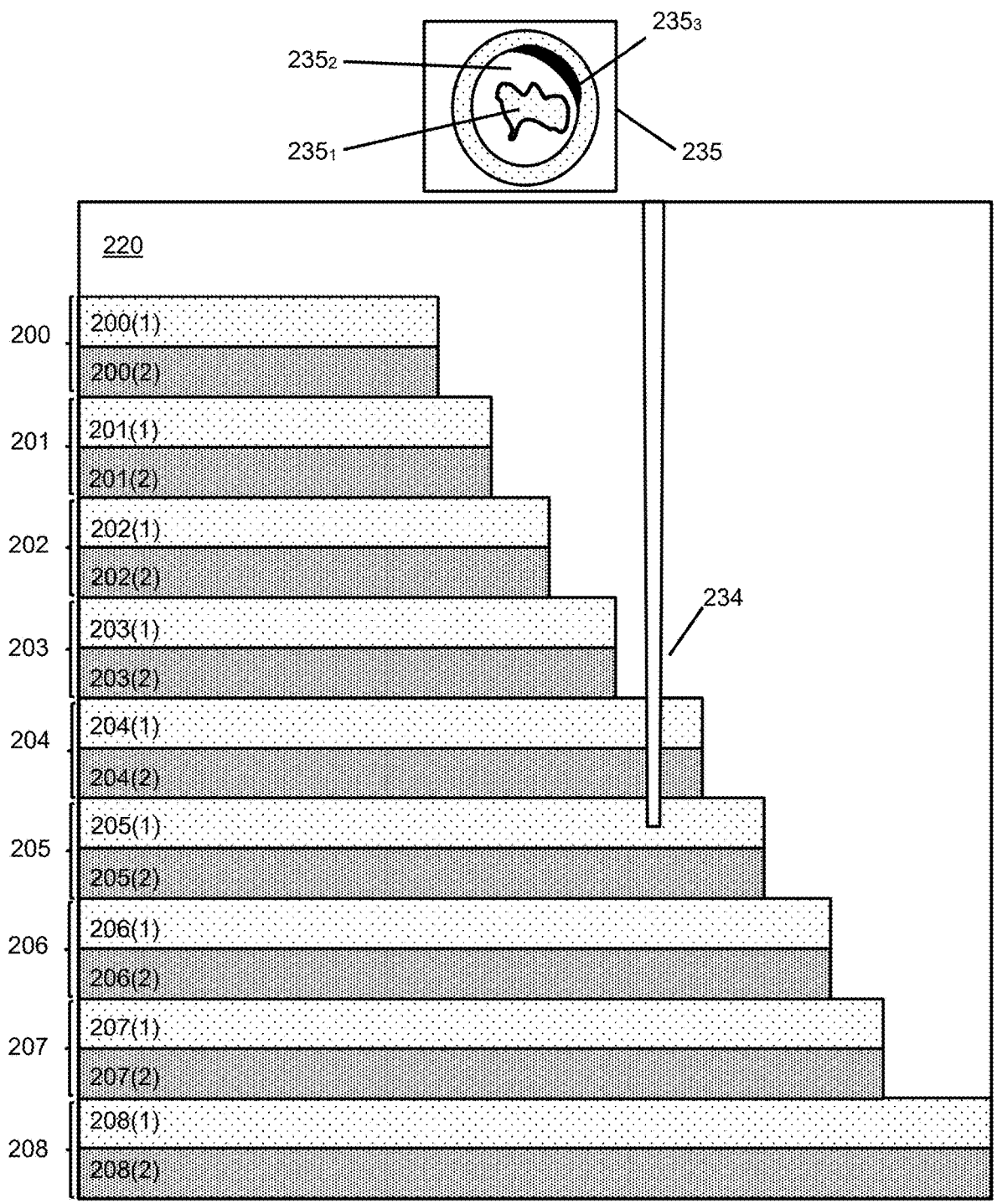
FIG. 2E illustrates a non-limitative example of a first-degree over-etched hole.

The third hole 234 of FIG. 2E is a first-degree over-etched hole. This kind of hole exposes the target layer, but also exposes a (single) additional layer located below the target layer. As visible in FIG. 2E, the third hole 234 exposes the fifth non-conductive layer 204(1) that is located above the fifth target layer 204(2) and belongs to the fifth set of layers 204, the fifth target layer 204(2) which is conductive, and the sixth non-conductive layer 205(1) that is located below the fifth target layer 204(2) and belongs to the sixth set of layers 205. Third hole 234 penetrates through the entire fifth target layer 204(2) but does not penetrate through the entire sixth non-conductive layer 205(1).

Note that the representation of FIG. 2E is schematic: generally, the hole passes through a multiplicity of layers (for example, a hundred—this is not limitative) until it reaches the target layer. FIG. 2E only depicts the deepest layers through which the hole passes.

Image 235 (e.g., SEM image) informative of the third hole 234 of FIG. 2E includes a first (inner) portion $235_1$ that represents the over etching that exposes sixth non-conductive layer 205(1), a second portion $235_2$ that represent the fifth target layer 204(2), and a peripheral region $235_3$ that represents the fifth non-conductive layer 204(1).

In some embodiments, the image of the first-degree over-etched hole is not symmetric (has no radial symmetry). This is illustrated in the non-limitative example of FIG. 2E.

Figure 2F:
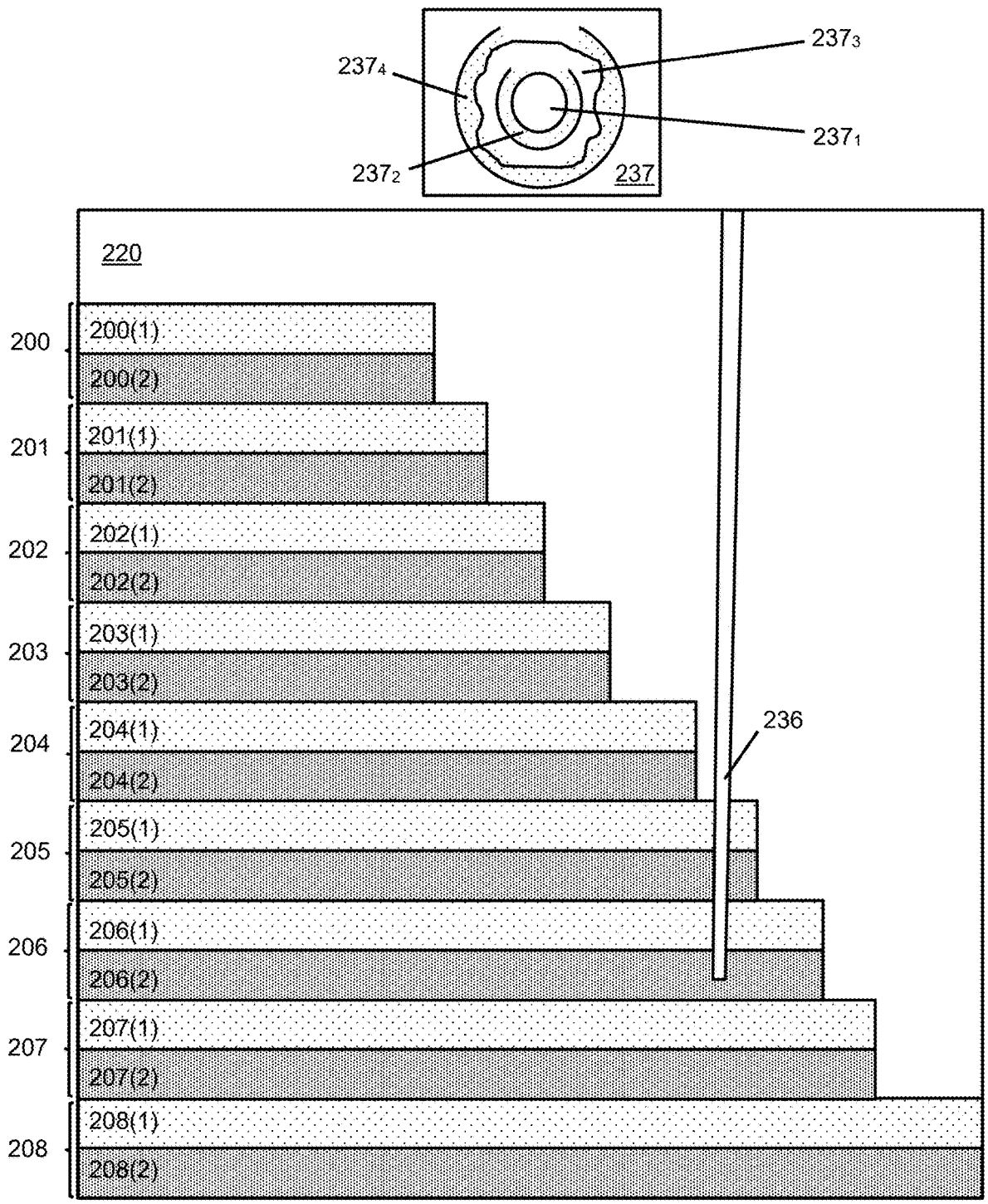
FIG. 2F illustrates a non-limitative example of a second-degree over-etched hole.

The fourth hole 236 of FIG. 2F is a second-degree over-etched hole. This kind of hole exposes the target layer, but also exposes two additional layers located below the target layer. As visible in FIG. 2F, the fourth hole 236 exposes the sixth non-conductive layer 205(1) that is located above the sixth target layer 205(2) and belongs to the sixth set of layers 205, the sixth target layer 205(2) which is conductive, the seventh non-conductive layer 206(1) that is located below the sixth target layer 205(2) and belongs to the seventh set of layers 206, and the seventh conductive layer 206(2) that is located below the seventh non-conductive layer and also belongs to the seventh set of layers 206.

Note that the representation of FIG. 2F is schematic: generally, the hole passes through a multiplicity of layers (for example, a hundred—this is not limitative) until it reaches the target layer. FIG. 2F only depicts the deepest layers through which the hole passes.

The fourth hole 236 penetrates through the entire sixth target layer 205(2) and also penetrates through the entire seventh non-conductive layer 206(1). If the fourth hole 236 is filled with conductive material, the sixth and seventh conductive layers will be shorted.

Image 237 (e.g., SEM image) informative of the fourth hole 236 of FIG. 2F includes a center $237_1$ (representative of the seventh conductive layer 206(2)), a first intermediate region $237_2$ which is partially annular (representative of the seventh non-conductive layer 206(1)), a second intermediate region $237_3$ (representative of the sixth conductive layer 205(2)) and a peripheral region $237_4$ that represents the sixth non-conductive layer 205(1).

In some embodiments, the image of the second-degree over-etched hole is not symmetric (has no radial symmetry). This is illustrated in the non-limitative example of FIG. 2F. Instead of obtaining an annular (ring) portion for the respective regions $237_2$ and $237_4$, only portions of rings are obtained.

Figure 3:
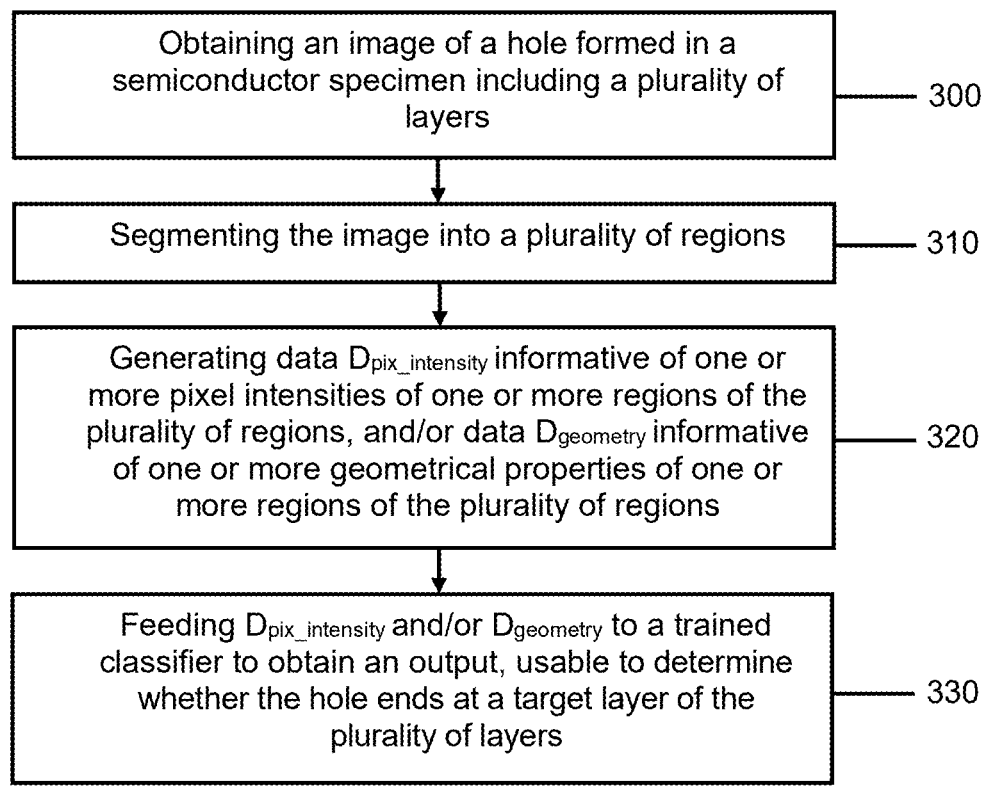
FIG. 3 illustrates a generalized flow-chart of a method of determining a class of a hole formed in a specimen, using an electron image of the hole.

Attention is now drawn to FIG. 3.

The method of FIG. 3 includes obtaining (operation 300) an image (electron image) of a hole formed in the semiconductor specimen.

According to some embodiments, a majority of (or all of) the area of the image which is obtained at operation 300 includes an image of the hole. According to some embodiments, an initial image of the specimen can be first obtained, which is then processed to extract thereof an image which comprises only (or mostly) the hole. In other words, the image of the hole is extracted from its background. The extraction of the hole from its background in the initial image can rely for example on an initial segmentation process (distinct from the segmentation performed at operation 310 and described hereinafter).

As described above with reference to FIGS. 2A to 2E, the specimen includes a plurality of layers. The hole exposes at least one layer of one or more sets of layers. The hole may expose one layer of a single set of layers, multiple layers of a single set of layers, and even layers from two or more sets of layers.

Generation of the image can include illuminating the hole with a charged particle beam, and detecting electrons emitted from the hole. The image can be provided e.g., by the examination tools 101 and/or 102.

Operation 300 can include acquiring the image by an examination tool or obtaining the image from an examination tool (without performing the electron image acquisition process).

The image acquisition process can include processing detection signals that represent the detection of the detected electrons. The processing of the detection signals may include applying at least one out of noise reduction operations, smoothing operations, and/or providing an electron image of a certain format. The certain format may be a gray level format—but other formats may be provided. The detected electrons may be secondary electrons, backscattered electrons, and the like. The electron image acquisition process may be executed by a scanning electron microscope (SEM) (by a critical dimension SEM or by a defect review SEM), by an electron beam imager, and the like.

The method of FIG. 3 further includes (operation 310) segmenting the image into a plurality of regions. Segmentation of the image divides the image into groups of pixels based on the pixel intensity distribution (e.g., grey level intensity distribution) and space connectivity. Operation 310 can rely on algorithms such as Edge Detection, Grey Level Segmentation, clustering, K-means, etc. These examples are not limitative.

According to some embodiments, a majority of the image (or all of the image) on which the segmentation (of operation 310) is performed corresponds to an image of the hole. Therefore, the segmentation of operation 310 is performed mostly (or only) on the image of the hole.

In some embodiments, the number of regions used to segment the image is stored as a predefined value. In some embodiments, the number of regions is a parameter of the segmentation algorithm, which can be selected e.g., by an operator. In some embodiments, the number of regions can differ depending on the type of the specimen, the type of the hole, etc.

Figure 4:
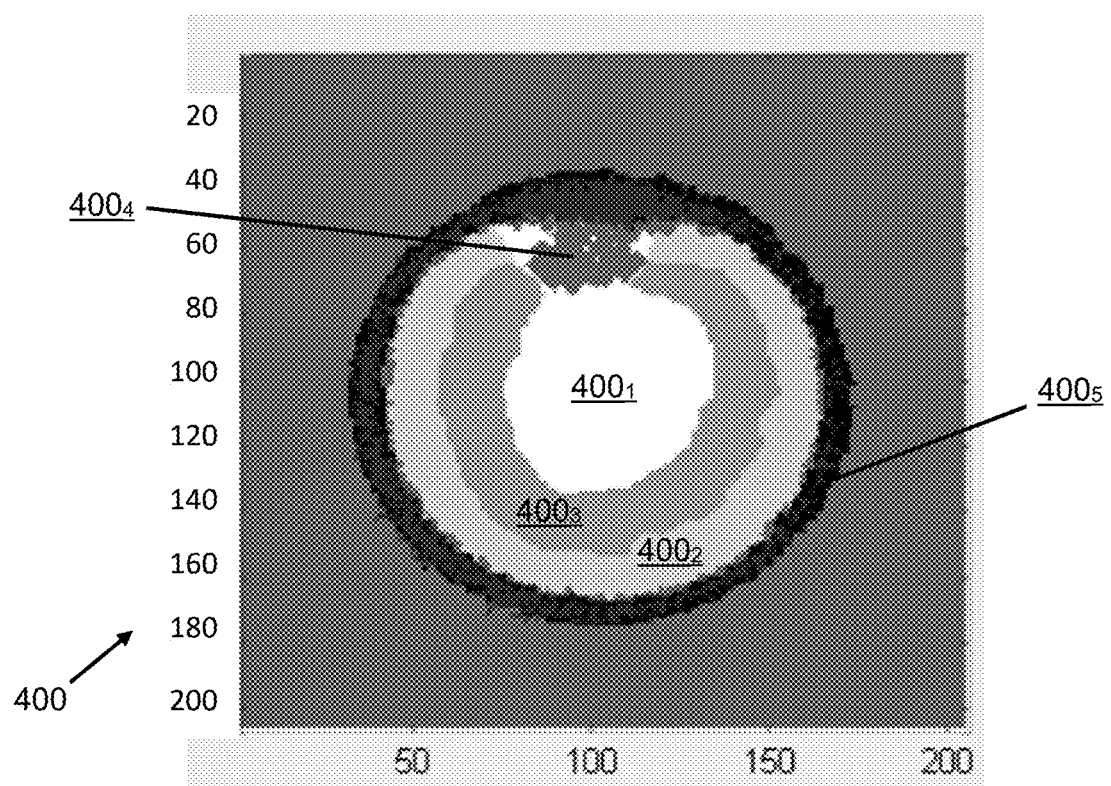
FIG. 4 illustrates a non-limitative example of a segmented image which can be generated by the method of FIG. 3.

A non-limitative example of a segmented image 400 obtained as the output of operation 310 is illustrated in FIG. 4.

In the non-limitative example of FIG. 4, the image 400 has been segmented into five regions $400_1$, $400_2$, $400_3$, $400_4$ and $400_5$. The region $400_1$ is the brightest region (has the lowest pixel intensity) and the region $400_5$ is the darkest region (has the highest pixel intensity). Note that the number of segments can be greater than five. In some embodiments, it can be selected as an integer equal to or greater than two. The value of N can be selected to enable a differentiation between the segments.

The method of FIG. 3 can further include (operation 320) generating data $D_{pix\_intensity}$ informative of one or more pixel intensities (grey level intensities) of one or more regions of the plurality of regions. $D_{pix\_intensity}$ can be obtained using the segmented image generated at operation 310. Various examples are provided hereinafter for $D_{pix\_intensity}$. In some embodiments, $D_{pix\_intensity}$ can be informative of the pixel intensity of a given region out of the plurality of regions. In some embodiments, $D_{pix\_intensity}$ is informative of the contrast between a given region and other regions. These examples are not limitative.

The method of FIG. 3 can further include (operation 320) generating data $D_{geometry}$ informative of one or more geometrical properties of one or more regions of the plurality of regions. $D_{geometry}$ can be obtained using the segmented image generated at operation 310. Various examples are provided hereinafter for $D_{geometry}$. In some embodiments, $D_{geometry}$ can be informative of the shape of the region. For example, it can indicate whether the region tends to have an annular (ring) shape (or at least a partial annular shape). In other examples, $D_{geometry}$ can be informative of a completeness of an annular region: it can indicate whether the region is a full annular region, or only a partial annular region. In other examples, $D_{geometry}$ can be informative of the dimensions of the region (e.g., whether the region is a thin or a thick annular region).

In some embodiments, only $D_{pix\_intensity}$ is computed. In other embodiments, only $D_{geometry}$ is computed. In other embodiments, both $D_{pix\_intensity}$ and $D_{geometry}$ are computed.

According to some embodiments, at least one of data $D_{pix\_intensity}$ or data $D_{geometry}$ comprises data usable to determine data informative of a depth of the hole. Indeed, as explained hereinafter, at least one of data $D_{pix\_intensity}$ or data $D_{geometry}$ can be fed to a classifier which outputs data informative of the depth of the hole. In particular, at least one of data $D_{pix\_intensity}$ or data $D_{geometry}$ can be used for indirect depth measurement of the hole, using a classification process (without requiring a direct depth measurement of the hole).

According to some embodiments, at least one of data $D_{pix\_intensity}$ or data $D_{geometry}$ comprises data informative of one or more physical attributes of the manufacturing process of the hole. In particular, according to some embodiments, at least one of data $D_{pix\_intensity}$ or data $D_{geometry}$ comprises data informative of one or more physical attributes of the manufacturing process of the hole in a NAND memory unit. At least one of data $D_{pix\_intensity}$ or data $D_{geometry}$ can therefore include data which is fitted to a manufacturing process used for manufacturing a NAND memory unit. Different examples of data $D_{pix\_intensity}$ and data $D_{geometry}$ are provided hereinafter.

In other words, at least one of data $D_{pix\_intensity}$ or data $D_{geometry}$ includes data selected to have a physical meaning. This data can contain physical information related to the manufacturing process. In particular, this data can be informative of (physical) attributes/properties of the manufacturing process (e.g., whether the manufacturing process enabled the hole to reach the target layer, or, alternatively, whether the manufacturing process generated an over-etch or an under-etch).

In some embodiments, an analysis of the manufacturing process of the hole (in case of an over-etch), and of the corresponding electron images, can reveal that when the image is segmented into a plurality of N regions $R_1$ to $R_N$, a predefined region $R_i$ (with i between 1 and N) is of particular interest to characterize the hole. In particular, this predefined region $R_i$ can be informative of an over-etch (e.g., first degree over-etched hole or second-degree over-etched hole). The method of FIG. 3 can therefore include determining data $D_{geometry}$ and/or data $D_{grey\_level}$ informative of this predefined region $R_i$.

According to some embodiments, N is an integer between 2 and 10.

In some embodiments, the predefined region $R_i$ informative of an over-etch is selected based on its pixel intensity with respect to the pixel intensity of the other regions. For example, assume that the regions $R_1$ to $R_N$ are ordered based on their brightness ($R_1$ being the brightest region, and $R_N$ being the darkest region), and N is equal to five, then the region $R_i$ can correspond to the region $R_3$ (the third darkest region). In FIG. 4, this region $R_3$ corresponds to the region $400_3$. This is not limitative and can vary, depending on the manufacturing process. It can occur that for a different manufacturing process, the region $R_i$ which is informative of the over-etch, is the brightest region $R_1$, or the second darkest region $R_2$, etc. The region $R_i$ can also depend on the number N selected for the segmentation. The relevant region $R_i$ for a given manufacturing process can be determined by an analysis of the manufacturing process (in case of an over-etch) and of the corresponding electron images. This analysis can indicate which region is the most relevant to characterize an over-etch.

The method of FIG. 3 further includes (operation 330) feeding $D_{pix\_intensity}$ and/or $D_{geometry}$ to a trained classifier, such as the trained classifier 112. In some embodiments, the trained classifier 112 has been trained to classify, based on $D_{pix\_intensity}$ and/or $D_{geometry}$, the hole into at least one class out of a plurality of classes.

In some embodiments, a plurality of different attributes $D_{pix\_intensity}$ (of different types), and/or a plurality of different attributes $D_{geometry}$ (of different types) are fed to the trained classifier 112 for a given image of a hole. Various examples of different attributes for $D_{pix\_intensity}$ and $D_{geometry}$ are provided hereinafter. The trained classifier 112 is therefore able to determine, based on a plurality of different attributes, the most appropriate class for the hole present in the image.

In some embodiments, the trained classifier 112 has been trained to perform a classification of the hole to a class out of different classes that represent different possible outcomes of a manufacturing process of the hole.

In some embodiments, the plurality of classes can include a properly etched hole (a non-limitative example of this class of hole is depicted in FIG. 2C), an under-etched hole (a non-limitative example of this class of hole is depicted in FIG. 2D), a first degree over-etched hole (a non-limitative example of this class of hole is depicted in FIG. 2E), and a second degree over-etched hole, wherein the second degree over etched-hole is deeper than the first degree over-etched hole (a non-limitative example of this class of hole is depicted in FIG. 2F). Note that a different number/different types of classes can be used.

In some embodiments, the plurality of classes can further include a class indicative of a defect (also called a black hat, since it is characterized by a cluster of dark pixels concentrated in a given area). This will be discussed further hereinafter with respect to FIG. 13.

The output of the trained classifier 112 is usable to determine whether the hole ends at a target layer of the plurality of layers. Indeed, if the trained classifier outputs that the hole belongs to the class "properly etched hole", this can be used to indicate (e.g., to a user, and/or to a computerized system), that the hole ends at the target layer of the plurality of layers.

If the trained classifier 112 outputs that the hole belongs to a class which is not the class "properly etched hole", this can be used to indicate (e.g., to a user, and/or to a computerized system), that the hole does not end at the target layer of the plurality of layers (this corresponds to a defective hole). Note that the output of the trained classifier 112 can provide details on the type of the defective hole: the output of the trained classifier 112 can be used to indicate whether the defective hole is an under-etched hole, a first degree over-etched hole, or a second degree over etched-hole.

Figure 5:
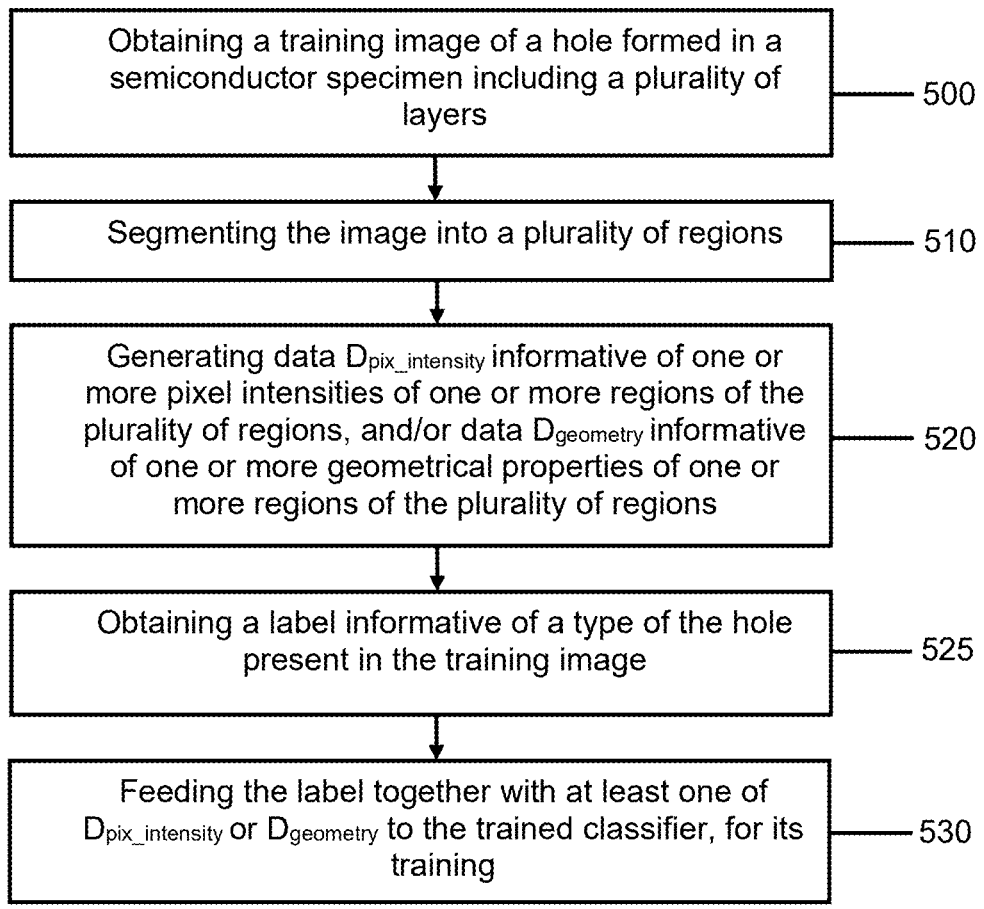
FIG. 5 illustrates a generalized flow-chart of a method of training a classifier to determine a class of a hole formed in a specimen, using a SEM image of the hole.

FIG. 5 illustrates a method of training the classifier 112.

The method of FIG. 5 includes obtaining (operation 500) a training image (e.g., SEM image) of a hole formed in a semiconductor specimen. In some embodiments, the training image can be an image acquired by an image acquisition device (see 101 and 102 in FIG. 1) or can be a simulated image.

The method of FIG. 5 further includes (operation 510) segmenting the image into a plurality of regions. Operation 510 is similar to operation 310 and is not described again. In some embodiments, instead of obtaining an image and segmenting the image, the method of FIG. 5 includes obtaining an image of a hole, which has already been segmented.

In some embodiments, the number of regions used to segment the image is predefined, or can be selected by an operator, as a parameter of the segmentation algorithm.

The method of FIG. 5 can further include (operation 520) generating data $D_{pix\_intensity}$ informative of one or more pixel intensities of one or more regions of the plurality of regions. $D_{pix\_intensity}$ can be obtained using the segmented image generated at operation 510. Various examples are provided hereinafter for $D_{pix\_intensity}$.

The method of FIG. 5 can further include (operation 520) data $D_{geometry}$ informative of one or more geometrical properties of one or more regions of the plurality of regions. $D_{geometry}$ can be obtained using the segmented image generated at operation 510. Various examples are provided hereinafter for $D_{geometry}$.

In some embodiments, only $D_{pix\_intensity}$ is computed. In other embodiments, only $D_{geometry}$ is computed. In other embodiments, both $D_{pix\_intensity}$ and $D_{geometry}$ are computed.

The method of FIG. 5 further includes (operation 525) obtaining a label, informative of a type (class) of the hole present in the image. The label can be provided by an operator (supervised learning). In some embodiments, the label can be indicative of one of the following types (classes): a properly etched hole, an under-etched hole, a first degree over-etched hole, and a second degree over-etched hole, wherein the second degree over etched-hole is deeper than the first degree over-etched hole. In some embodiments, the label can indicate whether a defect (present in a dark region of the segmented image) is present (this defect can be characterized by a cluster of dark pixels concentrated at a predefined location).

The method of FIG. 5 further includes (operation 530) feeding the label and $D_{pix\_intensity}$ and/or $D_{geometry}$ to the classifier 112, for its training. As a consequence, the classifier 112 is trained to classify the hole into a class out of different classes that represent different possible outcomes of a manufacturing process of the hole. In particular, the classes correspond to the types of holes present in the label.

In some embodiments, the plurality of classes can include a properly etched hole, an under-etched hole, a first degree over-etched hole, and a second degree over-etched hole, wherein the second degree over etched-hole is deeper than the first degree over-etched hole. Note that a different number/different types of classes can be used. In some embodiments, the plurality of classes can further include a class indicative of a defect (present in a dark region of the segmented image). This defect can be characterized by a cluster of dark pixels concentrated at a predefined location.

In some embodiments, a simplified list of classes can be used: the first class indicates that the hole ends at the target layer, and the second class indicates that the hole does not end at the target layer.

The method of FIG. 5 can be repeated for a plurality of training images. Note that the use of the attributes $D_{pix\_intensity}$ and/or $D_{geometry}$ enables training the classifier 112 without requiring an excessively large training set.

As can be understood, the training set, which includes data $D_{pix\_intensity}$ and/or data $D_{geometry}$ determined for each of a plurality of training images, together with the label (indicative of the class of each hole in each of the plurality of training images), enables training the classifier to automatically generate a model (computer-implemented model) which links the attributes ($D_{pix\_intensity}$ and/or $D_{geometry}$) to the classes of the hole.

Figure 6A:
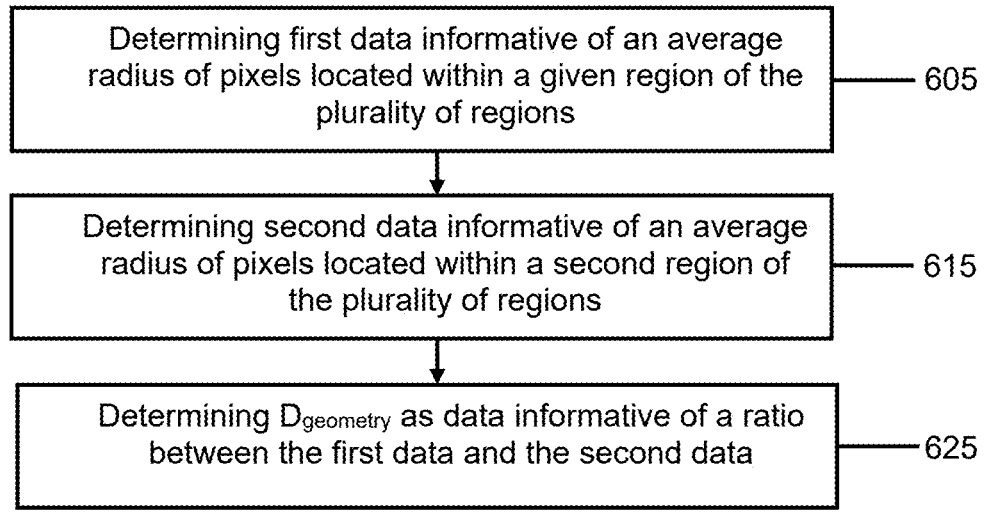
FIG. 6A illustrates a generalized flow-chart of a method of determining data informative of one or more geometrical properties of one or more regions of the plurality of regions present in the segmented image.
Figure 6B:
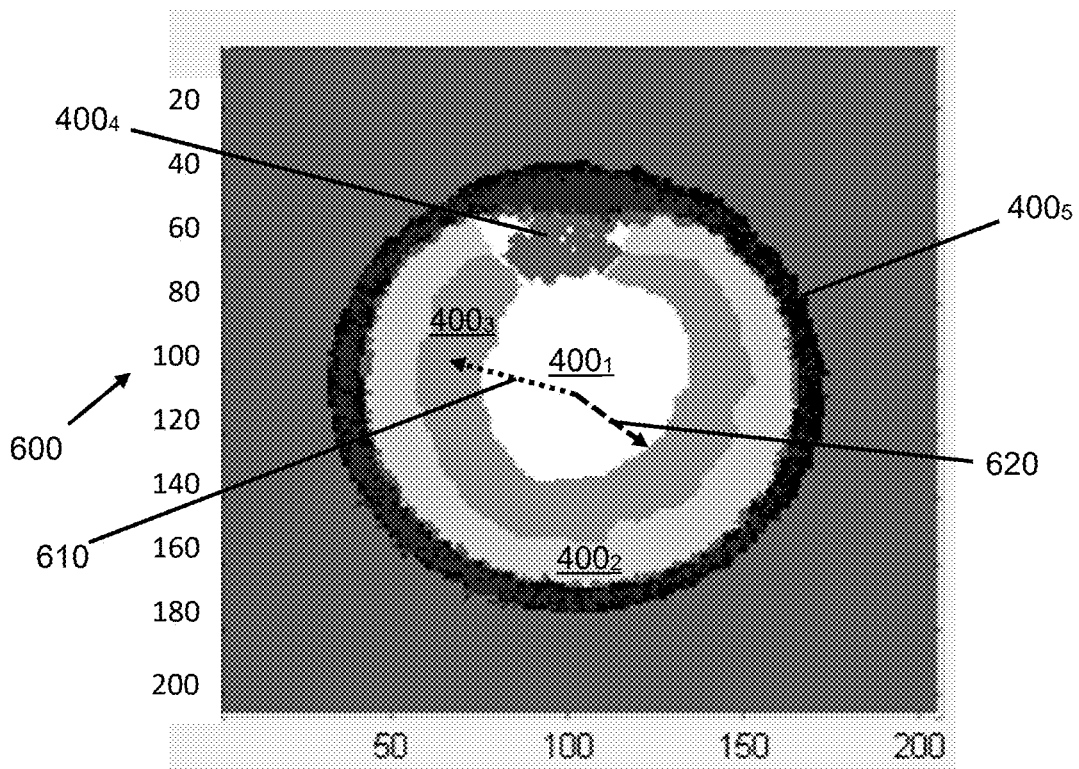
FIG. 6B illustrates an example of the method of FIG. 6A.

Attention is now drawn to FIGS. 6A and 6B.

According to some embodiments, first data $R_1$ informative of the average radius 610 of pixels belonging to a given region of the plurality of regions can be determined (operation 605). This average radius can be computed with respect to the center of gravity of the given region. This given region can correspond to an inner region of the image. Note that when the given region tends to be a continuous region, such as a disk (and not an annular region or partially annular region), the value of the radius 610 is smaller than when the given region tends to be an annular region or a partially annular region. In other words, this attribute can provide information on whether the given region tends to have (at least partially) an annular shape.

In some embodiments, assume that the image has been segmented into five regions $400_1$ to $400_5$ as explained in FIG. 4. The given region can be selected as the third darkest region $400_3$ (third highest grey level intensity) in the segmentation. Indeed, in some embodiments, this given region $400_3$ can be informative of an over-etch. Note that this is not limitative, and in other embodiments, another region can be considered, depending in particular on the manufacturing process.

In some embodiments, the first data $R_1$ informative of the radius 610 can be scaled. In particular, the method can include determining (operation 615) second data $R_2$ informative of an average radius 620 of pixels located within a second region of the plurality of regions, which is different from the given region. In some embodiments, the second region can be located closer to the centre of the image than the given region.

In some embodiments, assume that the image 600 has been segmented into five regions $400_1$ to $400_5$. The second region can be selected as the brightest region $400_1$ (smallest grey level intensity) in the segmentation.

In some embodiments, the second data informative of the average radius $R_2$ of the second region (region $400_1$) can be estimated using the following non-limitative formula:

$$R_2 = \sqrt{\frac{\text{Area of } 400_1}{\pi}}$$

In this formula, the area of the second region $400_1$ is noted "Area of $400_1$".

Data informative of a ratio between $R_1$ and $R_2$ can be determined and used as data $D_{geometry}$.

For example, the ratio can be determined as follows:

$$D_{geometry\_1} = 100 \frac{R_1}{R_2}$$

When $D_{geometry\_1}$ tends to have a high value (e.g. 100%), this tends to indicate that the given region (e.g. region $400_3$) has an annular shape, and when $D_{geometry\_1}$ has a small value, this tends to indicate that the given region (e.g. region $400_3$) does not have an annular shape. As mentioned above, an annular shape of the given region, can, in some embodiments, be an indicator than an over-etch is present. This attribute can be used by the trained classifier 112 to determine the class of the hole.

According to some embodiments, $D_{pix\_intensity}$ can include data informative of an average pixel intensity of a given region of the plurality of regions. In particular, in some embodiments, data informative of an average pixel intensity is determined for a region which is informative of an over-etch.

In some embodiments, assume that the image has been segmented into five regions $400_1$ to $400_5$ as explained in FIG. 4. The average pixel intensity of the third darkest region $400_3$ (third highest grey level intensity) in the segmentation can be determined. As mentioned above, in some embodiments, the region $400_3$ is informative of a possible over-etch. Therefore, the average pixel intensity for this region $400_3$ can used by the classifier 112 to determine the class of the hole. Note that this is not limitative, and in other embodiments, another region can be considered, depending in particular on the manufacturing process.

If the average pixel intensity of the region $400_3$ is high, this may be an indication that an over-etch is present, and if the average pixel intensity of the region $600_3$ is low, this may be an indication that an over-etch is not present. Note that this is not limitative, and the classification is performed by the classifier 112.

Figure 7:
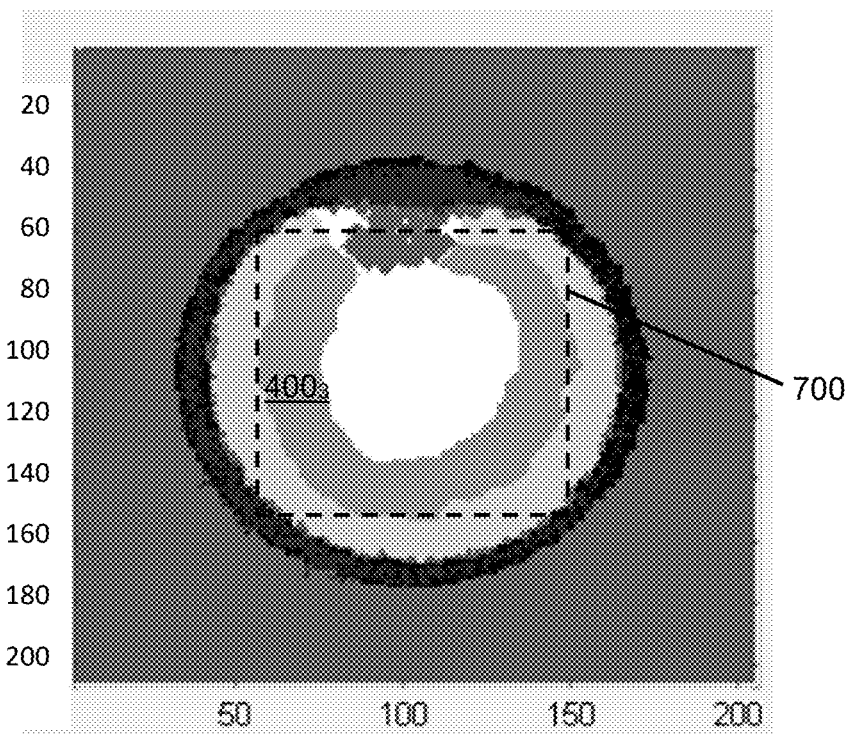
FIG. 7 illustrates an example of data informative of one or more geometrical properties of one or more regions of the plurality of regions present in the segmented image.

Attention is now drawn to FIG. 7.

According to some embodiments, $D_{geometry}$ includes data informative of a ratio between an area of a given region of the plurality of regions (of the segmented image) and a bounding area. In some embodiments, the given region can be a region informative of an over-etch.

If this ratio is high, there is a low probability that the given region has an annular or ring shape (indeed, the ratio indicates that the given region of interest fills most of the bounding area). This can indicate that there is a low probability that an over-etch is present.

If the ratio is low, there is a high probability that the given region has an annular or ring shape (indeed, the ratio indicates that the given region of interest fills only part of the bounding area). This can indicate that there is a high probability that an over-etch is present (since such annular region is generally present when an over-etch is present). This is not limitative, and the decision regarding the hole classification is performed by the classifier 112.

In the example of FIG. 7, the bounding area is a bounding box 700 (e.g., bounding rectangle or square). The given region is, in this example, the region $400_3$ which has the third highest pixel intensity (out of the five regions). This is however not limitative. In the example of FIG. 7, the ratio is small, which indicates that the region $400_3$ tends to have, at least partially, an annular shape.

Figure 8:
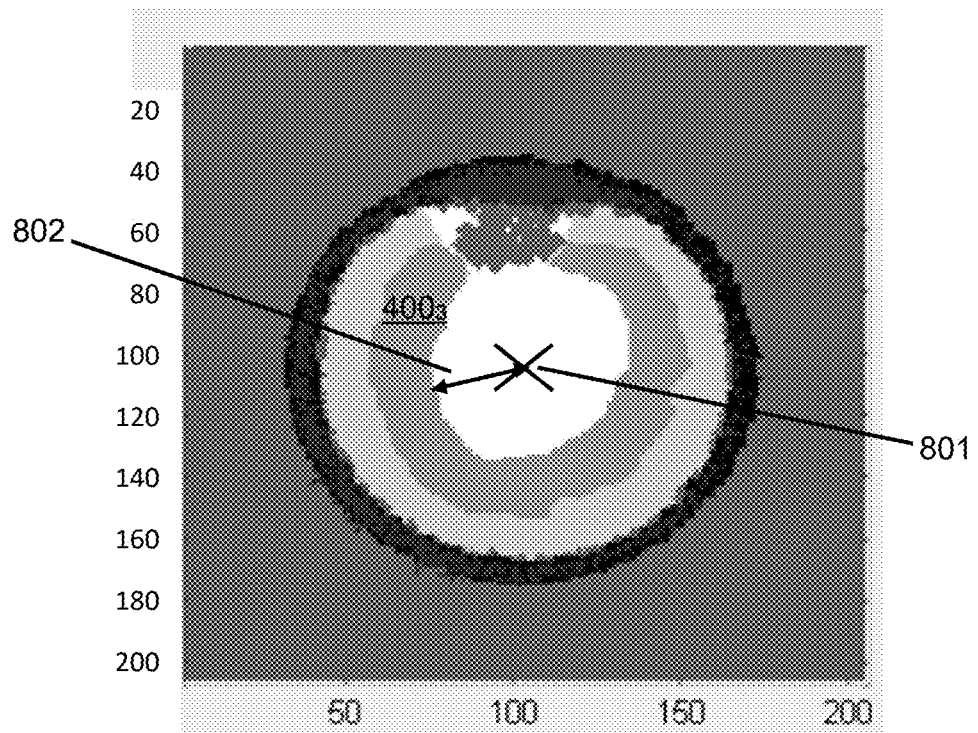
FIG. 8 illustrates another example of data informative of one or more geometrical properties of one or more regions of the plurality of regions present in the segmented image.

Attention is now drawn to FIG. 8.

According to some embodiments, $D_{geometry}$ is informative of a distance between a centre of gravity of a given region of the plurality of regions, and a pixel of the given region which is the closest to the centre of gravity. In other words, the smallest radius of the given region is determined. In some embodiments, the given region can be a region informative of an over-etch.

An example is provided in FIG. 8. The given region is, in this example, the region $400_3$ which has the third highest pixel intensity (out of the five regions output by the segmentation). This is however not limitative. The center of gravity of the given region $400_3$ is noted 801. The distance between this center 801 and the closest pixel of the region $400_3$ is noted 802. The distance can be computed using the operator "distance transform".

If this distance is high, there is a high probability that the given region has an annular or ring shape. This can indicate that there is a high probability that an over-etch is present.

If this distance is small, there is a low probability that the given region has an annular or ring shape. This can indicate that there is a low probability that an over-etch is present. This is not limitative, and the final decision regarding the hole classification is performed by the classifier 112.

Figure 9:
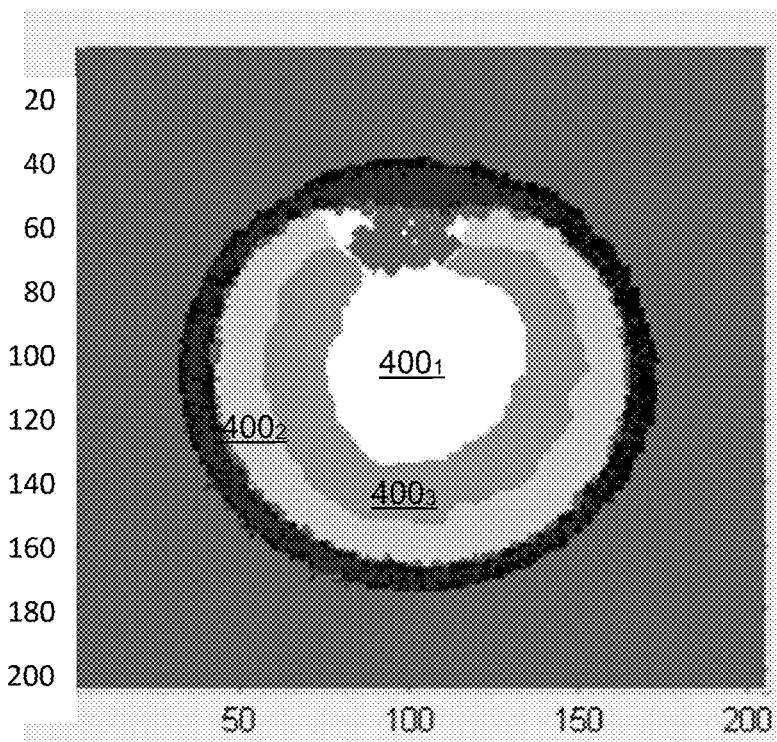
FIGS. 9 to 11 illustrates various different examples of data informative of one or more pixel intensities of one or more regions of the plurality of regions of the segmented image.

Attention is now drawn to FIG. 9.

According to some embodiments, $D_{pix\_intensity}$ includes data informative of a pixel intensity contrast between a given region, and one or more other regions different from the given region. In some embodiments, the given region can be a region informative of an over-etch.

An example is provided in FIG. 9. Assume that the given region corresponds to the region $400_3$ which has the third highest pixel intensity (out of the five regions output by the segmentation). The contrast between the given region $400_3$ and the union of two other regions (the region $400_1$, which has the lowest pixel intensity, and the region $400_2$, which has the second highest pixel intensity) different from the given region, can be computed. In other words, the contrast between the given region $400_3$ and its background (local background) is computed. Note that this is not limitative, and the contrast can be computed for different regions.

In some embodiments, the contrast can be computed as follows:

$$\frac{|\text{mean}(img(\text{background})) - \text{mean}(img(\text{given region}))|}{\sqrt{std(img(\text{background}))^2 + std(img(\text{given region}))^2}}$$

In this formula, img(background) corresponds to the pixel intensity of the background (e.g., regions $400_1$ and $400_2$) and img(given region) corresponds to the pixel intensity of the given region (e.g., region $400_3$).

If the computed contrast is high, this can indicate that there is a high probability that an over-etch is present. Indeed, a high contrast indicates that the given region $400_3$ strongly differentiates from its background, and therefore can be indicative of an over-etch.

If the computed contrast is small, this can indicate that there is a low probability that an over-etch is present. This is not limitative, and the final decision regarding the hole classification is performed by the classifier 112.

Figure 10:
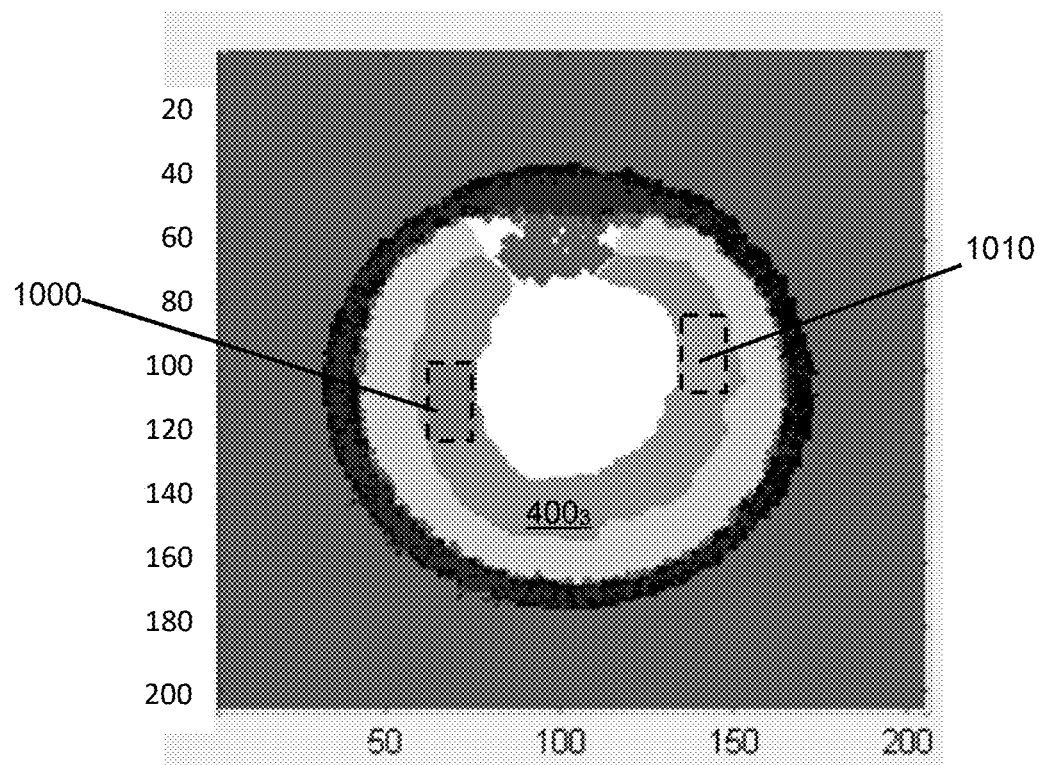

Attention is now drawn to FIG. 10.

Each region output by the segmentation can include various levels of pixel intensities. Assume that a given region of the plurality of regions includes a darkest area (a cluster of pixels which have the highest pixel intensity in this given region) and a brightest area (cluster of pixels which have the smallest pixel intensity in this given region). According to some embodiments, $D_{pix\_intensity}$ can include data informative of a contrast between the darkest area and the brightest area of the given region. In some embodiments, the given region can be a region informative of an over-etch.

A non-limitative example is provided in FIG. 10.

Assume that the given region corresponds to the region $400_3$ which has the third highest pixel intensity (out of the five regions output by the segmentation). The contrast between the darkest area 1000 of the given region $400_3$ and the brightest area 1010 of the given region $400_1$ can be computed. This is not limitative, and this computation can be performed for a different region.

If the computed contrast is high, there is a low probability of the region having an annular shape, and, in turn, this can indicate a low probability that an over-etch is present.

If the computed contrast is small, there is a high probability of the region having an annular shape, and, in turn, this can indicate a high probability that an over-etch is present. This is not limitative, and the final decision regarding the hole classification is performed by the classifier 112.

According to some embodiments, $D_{pix\_intensity}$ includes data informative of a contrast at a border between a given region, and a second region different from the given region. The contrast at the border can be computed using the Kolmogorov-Smirnov method (available e.g., in the library SciPy).

In some embodiments, the second region is located within the given region.

In some embodiments, the given region can be a region informative of an over-etch.

Figure 11:
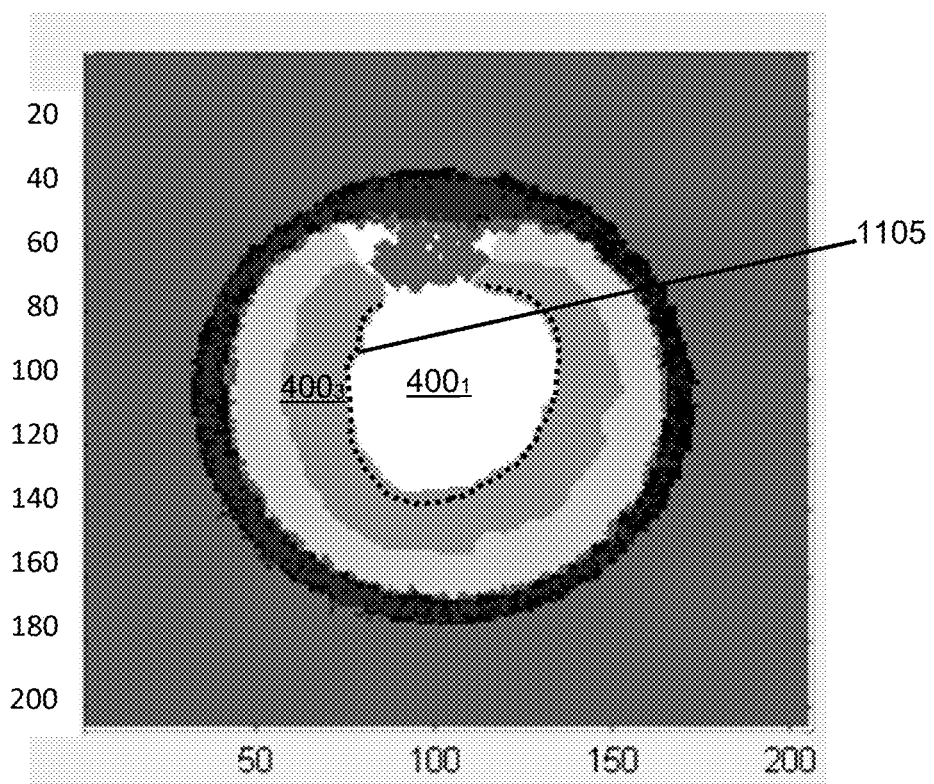
Figure 12:
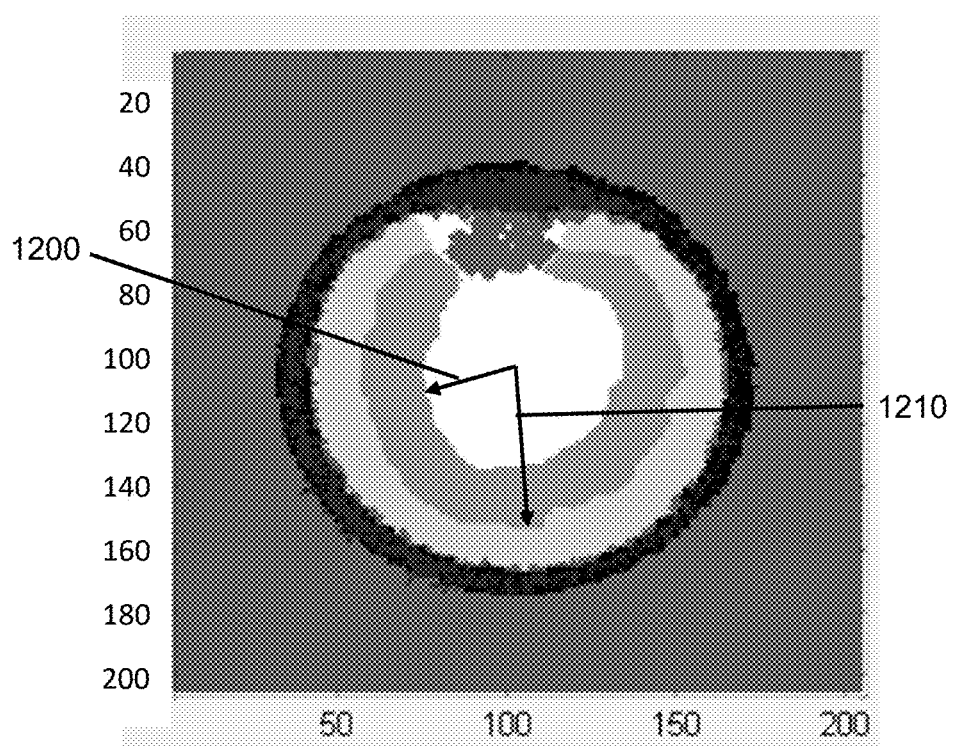
FIG. 12 illustrates another example of data informative of one or more geometrical properties of one or more regions of the plurality of regions present in the segmented image.

An example is provided in FIG. 11. Assume that the given region corresponds to the region $400_3$ which has the third highest pixel intensity (out of the five regions). This is however not limitative. Assume that the second region corresponds to the region $400_1$, which has the smallest pixel intensity. The border between the region $400_3$ and the area $400_1$ is noted 1105. The pixel intensity contrast between the region 10003 and the area 1000₁ at the border 1005 is computed.

If the computed contrast is high, there is a high probability that the given region is a ring (i.e., is annular shaped). Indeed, this indicates that there is a strong differentiation between the inner second region and the outer given region. Therefore, there is a high probability that an over-etch is present.

If the computed contrast is small, there is a low probability that the given region is a ring (i.e., is annular shaped). Indeed, this indicates that the inner second region and the outer given region are, in fact, nearly the same continuous region. Therefore, there is a low probability that an over-etch is present. This is not limitative, and the final decision regarding the hole classification is performed by the classifier 112.

Attention is now drawn to FIG. 11.

According to some embodiments, $D_{geometry}$ includes data informative of a ratio between:
 a distance 1200 between a centre of gravity of a given region of the plurality of regions, and a pixel of the given region, which is the closest to the centre of gravity, and
 a distance 1210 between the centre of gravity of a given region of the plurality of regions, and a pixel of the given region which is the farthest from the centre of gravity.

This attribute indicates whether the shape of the given region tends to be a disk or an annular shape. This attribute can also provide indication on the thickness of the annular shape (or partial annular shape).

In some embodiments, the given region can be a region informative of an over-etch.

Assume that the given region corresponds to the region $400_3$ which has the third highest pixel intensity (out of the five regions output by the segmentation). Note that this is not limitative, and another region can be selected in different embodiments. The ratio can correspond to the ratio between the distance 1200 and the distance 1210, or conversely.

If the computed ratio is high, there is a low probability of the region having an annular shape (or partial annular shape), and, in turn, this can indicate a low probability that an over-etch is present.

If the computed ratio is small, there is a high probability of the region having an annular shape, and, in turn, this can indicate a high probability that an over-etch is present. This is not limitative, and the final decision regarding the hole classification is performed by the classifier 112.

Figure 13:
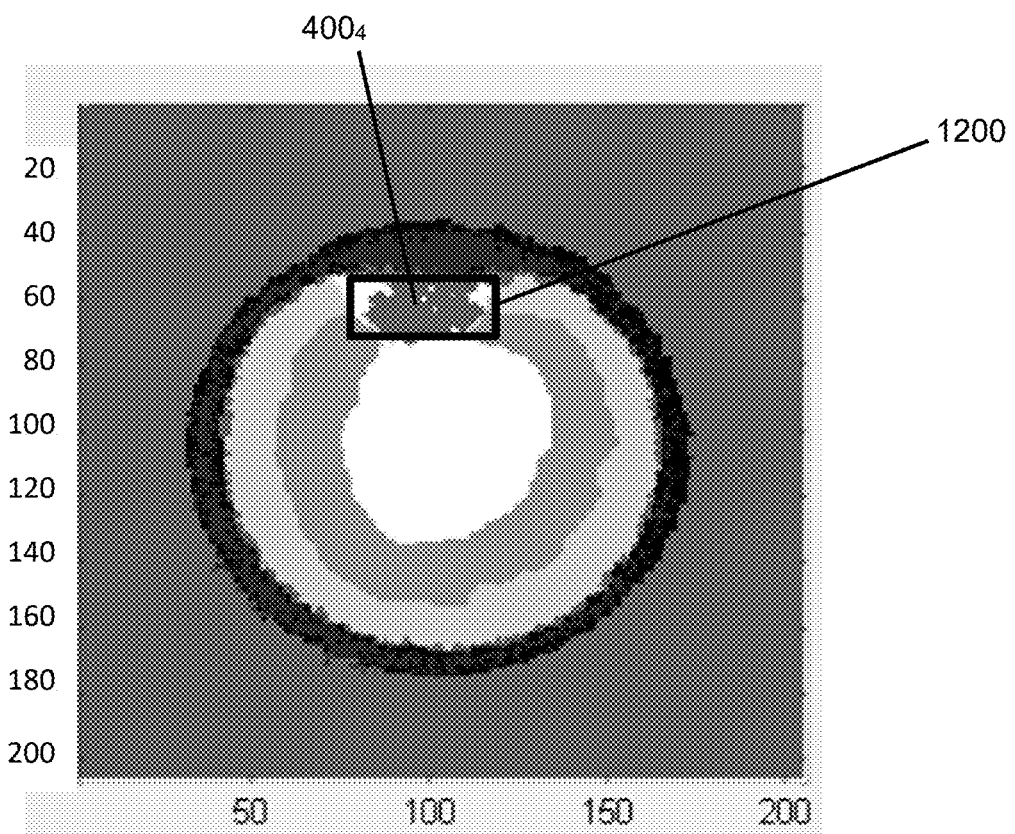
FIG. 13 illustrates an example of determining data informative of a defect in the manufacturing process.

Attention is now drawn to FIG. 13.

In some embodiments, it is possible to determine data informative of a number of pixels in a predefined zone (that is to say, a zone with a predefined location) of a region of the plurality of regions, wherein the region is associated with a pixel intensity above a threshold.

Indeed, for at least one manufacturing process, it turns out that the presence of a cluster of pixels at a predefined location of a "dark" region of the segmented image, is indicative of a defect. The attribute mentioned above can therefore be fed to the trained classifier 112, which can determine whether there is indeed a defect. Note that this defect can be present even if there is no over-etch.

This defect can stem from the manufacturing process of the hole. In some cases, this can be due to the high concentration of oxygen in one or more layers. The operator of the manufacturing process wishes to receive information on the presence of such a defect, in order to improve the manufacturing process.

In some embodiments, the defect is a side over-etch generated during the etch process. A side over-etch may be generated in the channel wall, e.g., along a horizontal direction or along a direction orthogonal to the etch direction, during the etch process. An attribute (such as the attribute mentioned above) informative of this defect can be generated, to enable the classifier 112 to detect this defect.

A non-limitative example of this defect is illustrated in FIG. 13.

Assume that the region 400₄ is selected as the region which has a pixel intensity above a threshold (in this example, region 400₄ is the fourth darkest region). Note that this is not limitative, and another region can be selected in different embodiments. In some embodiments, both the region 400₄ and the region 400₅ can be selected.

The predefined zone 1200 corresponds to the zone of region 400₄, which is located in the middle upper part of the image.

The number of pixels within the predefined zone 1200 is counted and stored as an attribute. This attribute can be fed to the trained classifier 112. If this number of pixels is large, this is generally indicative of a defect (also called "black hat"), which can be detected by the trained classifier 112.

Although in the images of FIGS. 6B to 13, each region of the segmentation clearly differentiates from the other regions, the actual images received by the system are generally associated with a lower signal to noise ratio.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A system comprising at least one processor and memory circuitry (PMC) configured to:
   obtain an image of a hole formed in a semiconductor specimen, wherein the hole exposes at least one layer of a plurality of layers of the semiconductor specimen,
   segment the image into a plurality of N regions $R_1$ to $R_N$, wherein, for a manufacturing process of said hole, a predefined region $R_i$ is informative of an over-etch, with i between 1 and N,
   generate at least one of:
   data $D_{pix\_intensity}$ informative of one or more pixel intensities of the predefined region $R_i$, or
   data $D_{geometry}$ informative of one or more geometrical properties of the predefined region $R_i$, and
   feed at least one of $D_{pix\_intensity}$ or $D_{geometry}$ to a trained classifier to obtain an output, wherein the output of the trained classifier is usable to determine whether the hole ends at a target layer of the plurality of layers.

2. The system of claim 1, wherein the output of the trained classifier is informative of a classification of the hole to a class out of different classes that represent different possible outcomes of a manufacturing process of the hole.

3. The system of claim 2, wherein the different classes include at least one of:
   (i) a properly etched hole,
   (ii) an under-etched hole,
   (iii) a first-degree over-etched hole, or
   (iv) a second-degree over-etched hole, wherein the second-degree over-etched hole is deeper than the first-degree over-etched hole.

4. The system of claim 1, wherein at least one of (i) or (ii) or (iii) is met:
   (i) the hole is a tilted hole,
   (ii) the image is not radially symmetric, or
   (iii) the system is configured to segment the image into a plurality of segments,
   wherein a majority or all of an area of the image on which said segmentation is performed corresponds to an image of the hole.

5. The system of claim 1, wherein the predefined region $R_i$, informative of an over-etch, is selected based on its pixel intensity with respect to the pixel intensity of the other regions.

6. The system of claim 1, wherein at least one of (i) or (ii) or (iii) is met:
   (i) at least one of data $D_{pix\_intensity}$ or data $D_{geometry}$ comprises data usable to determine data informative of a depth of the hole;
   (ii) at least one of data $D_{pix\_intensity}$ or data $D_{geometry}$ comprise data informative of one or more physical attributes of a manufacturing process of the hole; or (iii) at least one of data $D_{pix\_intensity}$ or data $D_{geometry}$ comprise data informative of one or more physical attributes of a manufacturing process of the hole in a NAND memory unit.

7. The system of claim 1, wherein data $D_{pix\_intensity}$ comprises data informative of an average pixel intensity of a given region of the plurality of regions.

8. The system of claim 1, wherein $D_{geometry}$ comprises data informative of a ratio between an area of a given region of the plurality of regions and a bounding area.

9. The system of claim 1, wherein $D_{geometry}$ comprises data informative of a distance between a centre of gravity of a given region of the plurality of regions and a pixel of the given region which is the closest to the centre of gravity.

10. The system of claim 1, wherein $D_{pix\_intensity}$ comprises data informative of a contrast between a given region of the plurality of regions and one or more regions different from the given region.

11. The system of claim 1, wherein a given region of the plurality of regions includes a darkest area and a brightest area, wherein $D_{pix\_intensity}$ comprises data informative of a contrast between the darkest area and the brightest area.

12. The system of claim 1, wherein $D_{pix\_intensity}$ comprises data informative of a contrast at a border between a given region of the plurality of regions, and a second region of the plurality of regions, different from the given region.

13. The system of claim 1, wherein $D_{geometry}$ comprises data informative of a ratio between:
   a distance between a centre of gravity of a given region of the plurality of regions, and a pixel of the given region, which is closest to the centre of gravity, and
   a distance between the centre of gravity of the given region of the plurality of regions, and a pixel of the given region, which is farthest from the centre of gravity.

14. The system of claim 1, wherein $D_{geometry}$ determined for a given region is informative of whether the given region has, at least partially, an annular shape.

15. The system of claim 1, wherein at least one of (i) or (ii) is met: (i) $D_{geometry}$ comprises data informative of a number of pixels in a predefined zone of a region of the plurality of regions, wherein the region is associated with a pixel intensity above a threshold, or (ii) $D_{geometry}$ comprises data informative of a side over-etch generated by a etch process of the hole.

16. The system of claim 1, wherein at least one of (i) or (ii) is met:
   (i) the hole exhibits a high aspect ratio and has a width of a nanometric scale, wherein the hole exposes at least one layer of one or more sets of layers, wherein each set of layers comprises layers that differ from each other by their electron yield, wherein the specimen is an intermediate product manufactured by one or more manufacturing stages of a manufacturing process of a three-dimensional NAND memory unit; or
   (ii) the hole has a depth between 50 nm and 10.000 nm.

17. A method, performed by at least one processor and memory circuitry (PMC), the method comprising:
   obtaining an image of a hole formed in a semiconductor specimen, wherein the hole exposes at least one layer of a plurality of layers of the semiconductor specimen,
   segmenting the image into a plurality of N regions $R_1$ to $R_N$, wherein, for a manufacturing process of said hole, a predefined region $R_i$ is informative of an over-etch, with i between 1 and N,
   generating at least one of:
      data $D_{pix\_intensity}$ informative of one or more pixel intensities of the predefined region $R_i$, or
      data $D_{geometry}$ informative of one or more geometrical properties of the predefined region $R_i$, and
   feeding at least one of $D_{pix\_intensity}$ or $D_{geometry}$ to a trained classifier to obtain an output, wherein the output of the trained classifier is usable to determine whether the hole ends at a target layer of the plurality of layers.

18. A non-transitory computer readable medium comprising instructions that, when executed by at least one processor and memory circuitry (PMC), cause the at least one PMC to perform operations comprising:
   obtaining an image of a hole formed in a semiconductor specimen, wherein the hole exposes at least one layer of a plurality of layers of the semiconductor specimen,
   segmenting the image into a plurality of N regions $R_1$ to $R_N$, wherein, for a manufacturing process of said hole, a predefined region $R_i$ is informative of an over-etch, with i between 1 and N,
   generating at least one of:
      data $D_{pix\_intensity}$ informative of one or more pixel intensities of the predefined region $R_i$, or
      data $D_{geometry}$ informative of one or more geometrical properties of the predefined region $R_i$, and
   feeding at least one of $D_{pix\_intensity}$ or $D_{geometry}$ to a trained classifier to obtain an output, wherein the output of the trained classifier is usable to determine whether the hole ends at a target layer of the plurality of layers.

19. A system comprising at least one processor and memory circuitry (PMC) configured to:
   obtain an image of a hole formed in a semiconductor specimen, wherein the hole exposes at least one layer of a plurality of layers of the semiconductor specimen,
   segment the image into a plurality of regions,
   generate data $D_{geometry}$ informative of a ratio between:
      first data informative of an average radius of pixels located within a given region of the plurality of regions, and
      second data informative of an average radius of pixels located within a second region of the plurality of regions, wherein the second region is different from the given region, and
   feed the data $D_{geometry}$ to a trained classifier to obtain an output, wherein the output of the trained classifier is usable to determine whether the hole ends at a target layer of the plurality of layers.

20. A method comprising, by at least one processor and memory circuitry (PMC):
   obtaining an image of a hole formed in a semiconductor specimen, wherein the hole exposes at least one layer of a plurality of layers of the semiconductor specimen,
   segmenting the image into a plurality of regions,
   generating data $D_{geometry}$ informative of a ratio between:
      first data informative of an average radius of pixels located within a given region of the plurality of regions, and
      second data informative of an average radius of pixels located within a second region of the plurality of regions, wherein the second region is different from the given region, and
   feeding the data $D_{geometry}$ to a trained classifier to obtain an output, wherein the output of the trained classifier is usable to determine whether the hole ends at a target layer of the plurality of layers.

21. A non-transitory computer readable medium comprising instructions that, when executed by at least one processor and memory circuitry (PMC), cause the at least one PMC to perform operations comprising:
  obtaining an image of a hole formed in a semiconductor specimen, wherein the hole exposes at least one layer of a plurality of layers of the semiconductor specimen,
  segmenting the image into a plurality of regions,
  generating data $D_{geometry}$ informative of a ratio between:
    first data informative of an average radius of pixels located within a given region of the plurality of regions, and
    second data informative of an average radius of pixels located within a second region of the plurality of regions, wherein the second region is different from the given region, and
  feeding the data $D_{geometry}$ to a trained classifier to obtain an output, wherein the output of the trained classifier is usable to determine whether the hole ends at a target layer of the plurality of layers.

* * * * *